United States Patent
Kobayashi et al.

(10) Patent No.: US 7,088,277 B2
(45) Date of Patent: Aug. 8, 2006

(54) ANALOG-TO-DIGITAL CONVERTER HAVING CYCLIC CONFIGURATION

(75) Inventors: Shigeto Kobayashi, Gifu (JP); Kuniyuki Tani, Ogaki (JP); Atsushi Wada, Ogaki (JP); Takafumi Nakamori, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/945,924

(22) Filed: Sep. 22, 2004

(65) Prior Publication Data

US 2005/0068219 A1 Mar. 31, 2005

(30) Foreign Application Priority Data

Sep. 25, 2003 (JP) .......................... 2003-334451
Feb. 3, 2004 (JP) .......................... 2004-027407

(51) Int. Cl.
*H03M 1/12* (2006.01)

(52) U.S. Cl. ...................... 341/155; 341/156
(58) Field of Classification Search ................ 341/155, 341/156, 161, 118, 120, 138, 140, 150, 139
See application file for complete search history.

(56) References Cited

U.S. PATENT DOCUMENTS 5,974,089 A * 10/1999 Tripathi et al. .............. 375/247
6,351,506 B1 * 2/2002 Lewicki ....................... 375/350
6,496,128 B1 * 12/2002 Wiesbauer et al. .......... 341/143
6,590,513 B1 * 7/2003 Stetson et al. ............... 341/143
6,741,194 B1    5/2004 Cassagnes et al. .......... 341/118
6,778,126 B1 * 8/2004 Ali ............................... 341/156

FOREIGN PATENT DOCUMENTS

JP         4-026229         1/1992
JP        11-145830         5/1999

* cited by examiner

*Primary Examiner*—Rexford Barine
*Assistant Examiner*—Joseph Lauture
(74) *Attorney, Agent, or Firm*—McDermott Will & Emery LLP

(57) ABSTRACT

A cyclic AD converter having a conversion processing speed or conversion accuracy designed no higher than necessary. In the AD converter, an input analog signal is held by a sample-and-hold circuit, and converted into a digital value by an AD conversion circuit. A DA conversion circuit converts the digital value output from the AD conversion circuit into an analog value. A subtractor circuit outputs the difference between the analog value output from the AD conversion circuit and the analog value held in the sample-and-hold circuit. An amplifier circuit amplifies the output of the subtractor circuit, and feeds back the resultant to the sample-and-hold circuit and the AD conversion circuit. In the course of this feedback-based cyclic processing, an amplification control circuit changes the gain of the amplifier circuit in accordance with the progress of the circulation.

7 Claims, 23 Drawing Sheets

ANALOG-TO-DIGITAL CONVERTER HAVING CYCLIC CONFIGURATION

BACKGROUND OF THE INVENTION

1. Field of the Invention

The present invention relates to an analog-to-digital converter. In particular, the invention relates to analog-to-digital conversion technologies of cyclic type.

2. Description of the Related Art (First Related Art)

Recently, cellular phones have incorporated a variety of additional functions such as an image capturing function, an image reproducing function, a moving image capturing function, and a moving image reproducing function. Reduced size and reduced power consumption are thus increasingly required of analog-to-digital converters (hereinafter, referred to as "AD converters"). One of the known forms of such AD converters is a cyclic AD converter which has a cyclic configuration (for example, see Japanese Patent Laid-Open Publication No. Hei 11-145830). FIG. 13 shows the configuration of a conventional cyclic AD converter. In this AD converter 150, an analog signal Vin input through a first switch 152 is sampled by a first amplifier circuit 156, and converted into a 1-bit digital value by an AD conversion circuit 158. The digital value is converted into an analog value by a DA conversion circuit 160, and subtracted from the input analog signal Vin by a subtractor circuit 162. The output of the subtractor circuit 162 is amplified by a second amplifier circuit 164, and fed back to the first amplifier circuit 156 through a second switch 154. This feedback-based cyclic processing is repeated 12 times to obtain 12 bits of digital value.

(Second Related Art)

There is known another form of the cyclic AD converter which has a cyclic configuration (for example, see Japanese Patent Laid-Open Publication No. Hei 4-26229).

FIG. 26 shows an example of the conventional cyclic AD converter. In this AD converter, an analog signal Vin input through a first switch SW101 is sampled and held by a sample-and-hold circuit 1011 as an analog signal equivalent to the input signal, and is converted into a digital value by an AD conversion circuit 1012. Initially, the top four bits are extracted. The digital value converted by the AD conversion circuit is converted into an analog value by a DA conversion circuit 1013. A subtractor 1014 subtracts the analog signal input from the DA conversion circuit 1013 from the input analog signal Vin that is sampled and held in the sample-and-hold circuit 1011. The output analog signal of the subtractor circuit 1014 is amplified by a second amplifier circuit 1015. Incidentally, the subtractor circuit 1014 and the second amplifier circuit may be a subtracting amplifier circuit 1016 of integral type. The analog signal amplified is fed back to the sample-and-hold circuit 1011 and the AD conversion circuit 1012 through a second switch SW102. In order to extract three bits at the second and subsequent cycles, the second amplifier circuit 1015 amplifies the input signal by eight. This cyclic processing is repeated to obtain a 13-bit digital value.

(First Problem)

The cyclic AD converter described in Japanese Patent Laid-Open Publication No. Hei 11-145830 is advantageous in suppressing the circuit area since it has a smaller number of elements as compared to multistage pipelined AD converters. For the sake of the reduced circuit area, however, the same circuits must be used repeatedly under the same condition throughout all the stages of the cyclic processing. Thus, specifications of the individual circuits included in the cyclic AD converter must be designed in view of the conversion of upper bits where particularly high conversion processing speed and conversion accuracy are required. This means that the conversion processing speed and conversion accuracy to be secured can sometimes be excessive to the entire process of the cyclic processing. Besides, securing excessive conversion processing speed and conversion accuracy throughout all the stages of the cyclic processing tends to increase the power consumption.

(Second Problem)

The cyclic AD converter described in Japanese Patent Laid-Open Publication No. Hei 4-26229 extracts upper bits before the subtraction of the corresponding analog signal. Thus, the analog signal resulting from the subtraction must be amplified according to the number of bits for the AD conversion circuit in the subsequent stages to extract.

Nevertheless, amplifier circuits have a limit of the gain bandwidth product (GB product). More specifically, obtaining higher gains lowers the operating frequencies of the amplifier circuits, which can make high speed operation difficult. Then, if the AD conversion circuit of cyclic type can change its signal range necessary for the conversion at the second and subsequent cycles by using a substitute technique other than the amplification of the input analog signal, it is possible to ease the limitation of the amplifier circuit and enhance the design flexibility of the entire AD converter.

SUMMARY OF THE INVENTION

The present invention has been achieved in view of the foregoing. It is thus an object of the present invention to optimize the conversion accuracy or reduce the power consumption of the AD converter.

(First Group)

One of the aspects of the present invention is an analog-to-digital converter. This analog-to-digital converter comprises: an AD conversion circuit which converts an input analog signal into a predetermined number of bits of digital value; a DA conversion circuit which converts the output of the AD conversion circuit into an analog signal; a subtractor circuit which subtracts the output of the DA conversion circuit from the input analog signal; an amplifier circuit which amplifies the output of the subtractor circuit and feeds back the resultant to the AD conversion circuit; and a circuit which changes a specification of at least any one of the AD conversion circuit, the DA conversion circuit, the subtractor circuit, and the amplifier circuit in accordance with the progress of the feedback-based cyclic processing.

Here, the "specification" of the circuits may be parameters such as the gain of signal amplification, the power to be supplied, the pulse width of a control signal, and a capacitance to be included. According to the present aspect, each parameter can be changed in accordance with the progress of the cyclic processing. It is therefore possible to obtain high conversion accuracies as needed, and achieve power saving as needed.

Another aspect of the present invention is also an analog-to-digital converter. This analog-to-digital converter comprises: an AD conversion circuit which converts an input analog signal into a predetermined number of bits of digital value; a DA conversion circuit which converts the output of the AD conversion circuit into an analog signal; a subtractor circuit which subtracts the output of the DA conversion circuit from the input analog signal; an amplifier circuit which amplifies the output of the subtractor circuit and feeds back the resultant to the AD conversion circuit; and an amplification control circuit which changes gain of the amplifier circuit in accordance with the progress of the feedback-based cyclic processing.

Amplifier circuits having higher gains require longer settling time. Thus, when an amplifier circuit having a high gain is adopted, it is sometimes impossible to obtain an appropriate output, possibly lowering the conversion accuracy of the entire analog-to-digital converter. According to the present aspect, the gain of the amplifier circuit can be lowered to obtain a required conversion accuracy during processing in which a relatively high conversion accuracy is required. In particular, when the analog-to-digital conversion is conducted in a plurality of separate stages, the gain of the amplifier circuit is lowered to obtain a necessary conversion accuracy in an initial stage where a relatively high accuracy is required.

Still another aspect of the present invention is also an analog-to-digital converter. This analog-to-digital converter comprises: an AD conversion circuit which converts an input analog signal into a predetermined number of bits of digital value; a DA conversion circuit which converts the output of the AD conversion circuit into an analog signal; a subtractor circuit which subtracts the output of the DA conversion circuit from the input analog signal; an amplifier circuit which amplifies the output of the subtractor circuit and feeds back the resultant to the AD conversion circuit; and a power control circuit which changes power supplies to the respective circuits in accordance with the progress of the feedback-based cyclic processing.

In conventional cyclic AD converters, analog-to-digital conversion processing in a plurality of separate stages has been performed by using the same configuration under the same condition even for processing in which a relatively high conversion accuracy is required and for other processing. According to the present aspect, during processing in which a relative high conversion accuracy is required, i.e., during processing in which a relative high conversion speed is required, the necessary conversion accuracy can be obtained by increasing the power supplies while maintaining the processing time unchanged. In particular, when the analog-to-digital conversion is conducted in a plurality of separate stages as in an analog-to-digital converter of cyclic type, the power supplies to such component circuits as the amplifier circuit are increased to obtain the necessary conversion accuracy in an initial stage where a relatively high accuracy is required. In contrast, in the second and subsequent stages, the power supplies can be reduced for power saving.

Still another aspect of the present invention is also an analog-to-digital converter. This analog-to-digital converter comprises: an AD conversion circuit which converts an input analog signal into a predetermined number of bits of digital value; a DA conversion circuit which converts the output of the AD conversion circuit into an analog signal; a subtractor circuit which subtracts the output of the DA conversion circuit from the input analog signal; an amplifier circuit which amplifies the output of the subtractor circuit and feeds back the resultant to the AD conversion circuit; and a clock control circuit which changes the pulse width of a control signal to be input at least to the AD conversion circuit in accordance with the progress of the feedback-based cyclic processing.

According to the present aspect, during processing in which a relatively high conversion accuracy is required, i.e., during processing in which a relatively high conversion speed is required, the conversion speed itself is not increased but the pulse width of the clock signal which controls the operation of a circuit constituting the analog-to-digital converter is. This can increase the operating time of the AD conversion for the sake of the necessary conversion accuracy. In particular, when the analog-to-digital conversion is conducted in a plurality of separate stages as in an analog-to-digital converter of cyclic type, the pulse width of the clock signal which controls such component circuits as the AD conversion circuit, the DA conversion circuit, and the amplifier circuit is increased to obtain the necessary conversion accuracy in an initial stage where a relatively high accuracy is required. In contract, in the second and subsequent stages, it is even possible to reduce the processing time of the AD conversion for power saving.

Still another aspect of the present invention is also an analog-to-digital converter. This analog-to-digital converter comprises: a sample-and-hold circuit which holds an input analog signal; an AD conversion circuit which converts the input analog signal into a predetermined number of bits of digital value; a DA conversion circuit which converts the output of the AD conversion circuit into an analog signal; a subtractor circuit which subtracts the output of the DA conversion circuit from the input analog signal; an amplifier circuit which amplifies the output of the subtractor circuit and feeds back the resultant to the AD conversion circuit; and a capacitance control circuit which changes the capacitance of at least either one of the sample-and-hold circuit and the amplifier circuit in accordance with the progress of the feedback-based cyclic processing.

According to the present aspect, during processing in which a relatively high conversion accuracy is required, the capacitances of the sample-and-hold circuit and the amplifier circuit can be set relatively high so as to reduce the impact of thermal noise and the like which might lower the conversion accuracy of the analog-to-digital converter. In particular, when the analog-to-digital conversion is conducted in a plurality of separate stages as in an analog-to-digital converter of cyclic type, the capacitances of the sample-and-hold circuit and the amplifier circuit are set relatively high so that a necessary conversion accuracy is obtained in an initial stage where a relatively high accuracy is required. In contrast, in the second and subsequent stages, the capacitances can be reduced for power saving.

(Second Group)

One of the aspects of the present invention is an analog-to-digital converter. This analog-to-digital converter comprises: an AD conversion circuit which converts an input analog signal into a predetermined number of bits of digital value; a DA conversion circuit which converts the output of the AD conversion circuit into an analog signal; a subtractor circuit which subtracts the output of the DA conversion circuit from the input analog signal; an amplifier circuit which amplifies the output of the subtractor circuit with a predetermined gain, and feeds back the resultant to the AD conversion circuit; and a reference voltage control circuit which changes reference voltages to be supplied to a plurality of voltage comparison devices arranged in the AD conversion circuit.

According to the present aspect, the reference voltage control circuit can change the reference voltages supplied to the plurality of voltage comparison devices arranged in the AD conversion circuit. This makes it possible to reduce the gain of the amplifier circuit, for example. Besides, a specification of the AD converter can be changed without changing the circuit configuration. It is therefore possible to enhance the design flexibility of the entire AD converter.

Another aspect of the present invention is also an analog-to-digital converter. This analog-to-digital converter comprises: an AD conversion circuit which converts an input analog signal into a predetermined number of bits of digital value; a DA conversion circuit which converts the output of the AD conversion circuit into an analog signal; a first amplifier circuit which amplifies the input analog signal with a predetermined gain, being arranged in parallel with the AD conversion circuit; a subtractor circuit which subtracts, from the output of the first amplifier circuit, the output of the DA conversion circuit amplified with substantially the same gain as when amplified by the first amplifier circuit; a second amplifier circuit which amplifies the output of the subtractor circuit with a predetermined gain, and feeds back the resultant to the AD conversion circuit and the first amplifier circuit; and a reference voltage control circuit which temporally changes reference voltages to be supplied to a plurality of voltage comparison devices arranged in the AD conversion circuit.

According to the present aspect, the reference voltage control circuit can change the reference voltages supplied to the plurality of voltage comparison devices arranged in the AD conversion circuit. This makes it possible to change the reference voltages between when inputting an input signal and when inputting a feedback signal, for example. In this way, such a setting as achieves both lower voltages and higher speed can be made for enhanced design flexibility of the entire AD converter.

Another aspect of the present invention is also an analog-to-digital converter. This analog-to-digital converter comprises: an AD conversion circuit which converts an input analog signal into a predetermined number of bits of digital value; a DA conversion circuit which converts the output of the AD conversion circuit into an analog signal; a first amplifier circuit which amplifies the input analog signal with a predetermined gain, being arranged in parallel with the AD conversion circuit; a subtractor circuit which subtracts, from the output of the first amplifier circuit, the output of the DA conversion circuit amplified with substantially the same gain as when amplified by the first amplifier circuit; a second amplifier circuit which amplifies the output of the subtractor circuit with a predetermined gain, and feeds back the resultant to the AD conversion circuit and the first amplifier circuit; a reference voltage control circuit which changes reference voltages to be supplied to a plurality of voltage comparison devices arranged in the AD conversion circuit; and an amplification control circuit which changes the gain of the first amplifier circuit temporally.

According to the present aspect, it is possible to make such a setting that the reference voltage control circuit reduces the reference voltages supplied to the plurality of voltage comparison devices arranged in the AD conversion circuit while the voltage control circuit increases the gain of the first amplifier circuit which is arranged in parallel with the AD conversion circuit. As a result, the gain of the second amplifier circuit can be lowered further. Here, the gain of the first amplifier circuit can be increased after a fall of the input signal, whereby signal errors can be suppressed beyond the output range of the first amplifier circuit. It is therefore possible to enhance the design flexibility of the entire AD converter.

Another aspect of the present invention is also an analog-to-digital converter. This analog-to-digital converter is a converter which performs analog-to-digital conversion processing in a plurality of separate stages, comprising: an AD conversion circuit which converts an input analog signal into a predetermined number of bits of digital value at least in any one of the plurality of stages; a DA conversion circuit which converts the output of the AD conversion circuit into an analog signal; a subtractor circuit which subtracts the output of the DA conversion circuit from the input analog signal; an amplifier circuit which amplifies the output of the subtractor circuit for feedback; and a reference voltage control circuit which changes reference voltages to be supplied to a plurality of voltage comparison devices arranged in any of AD conversion circuits receiving feedback from the amplifier circuit.

According to the present aspect, the reference voltage control circuit can change the reference voltages supplied to the plurality of voltage comparing devices arranged in the AD conversion circuit. This makes it possible to reduce the gain of the amplifier circuit, for example. Besides, a specification of the AD converter can be changed without changing the circuit configuration. Consequently, it is possible to enhance the design flexibility of the entire AD converter which comprises the plurality of stages including a cyclic AD conversion stage(s).

Another aspect of the present invention is also an analog-to-digital converter. This analog-to-digital converter comprises: an AD conversion circuit which converts an input analog signal into a predetermined number of bits of digital value; a DA conversion circuit which converts the output of the AD conversion circuit into an analog signal; a subtractor circuit which subtracts the output of the DA conversion circuit from the input analog signal; an amplifier circuit which amplifies the output of the subtractor circuit with a predetermined gain, and feeds back the resultant to the AD conversion circuit; a reference voltage control circuit which changes reference voltages to be supplied to a plurality of voltage comparison devices arranged in the AD conversion circuit; and a sample-and-hold circuit which samples and holds the input analog signal, and adjusts the timing of input of the input analog signal to the subtractor circuit.

According to the present aspect, the reference voltage control circuit can change the reference voltages supplied to the plurality of voltage comparison devices arranged in the AD conversion circuit. This makes it possible to enhance the design flexibility of the entire AD converter. In the meantime, the sample-and-hold circuit holds the sampled analog signal during AD conversion, thereby avoiding a timing deviation and improving the high-frequency characteristics.

Another aspect of the present invention is also an analog-to-digital converter. This analog-to-digital converter comprises: an AD conversion circuit which converts an input analog signal into a predetermined number of bits of digital value; a DA conversion circuit which converts the output of the AD conversion circuit into an analog signal; a subtractor circuit which subtracts the output of the DA conversion circuit from the input analog signal; an amplifier circuit which amplifies the output of the subtractor circuit with a predetermined gain, and feeds back the resultant to the AD conversion circuit; a reference voltage control circuit which changes reference voltages to be supplied to a plurality of voltage comparison devices arranged in the AD conversion circuit; and a timing control circuit which generates and supplies timing to the reference voltage control circuit, with the feedback to the AD conversion circuit as a single cycle of the timing. Here, the reference voltage control circuit changes the reference voltages temporally in accordance with the timing supplied from the timing control circuit.

According to the present aspect, the reference voltage control circuit reduces the reference voltages supplied to the plurality of voltage comparison devices arranged in the AD conversion circuit in accordance with the timing generated by the timing control circuit. This design also allows a reduction in the gain of the amplifier circuit. It is therefore possible to enhance the design flexibility of the entire AD converter.

Incidentally, any combinations of the foregoing components, and the components and expressions of the present invention replaced with methods, apparatuses, systems, and the like mutually are also intended to constitute applicable aspects of the present invention.

According to the present invention, it is possible to optimize the conversion accuracy or reduce the power consumption of the AD converter.

BRIEF DESCRIPTION OF THE DRAWINGS

In FIG. 16, the AD conversion circuit consists of (n+1) resistors R1 to Rn+1, n voltage comparison devices D1 to Dn, and an encoder 121.

DETAILED DESCRIPTION OF THE INVENTION (First Group)
(First Embodiment)

In the present embodiment, the gain of an amplifier circuit included in an AD converter of cyclic type is changed in accordance with the progress of the cyclic processing. Specifically, the gain is controlled to be lower only in an initial stage where a relatively high conversion accuracy is required. This makes it possible to increase the conversion accuracy only when needed.

Figure 1:
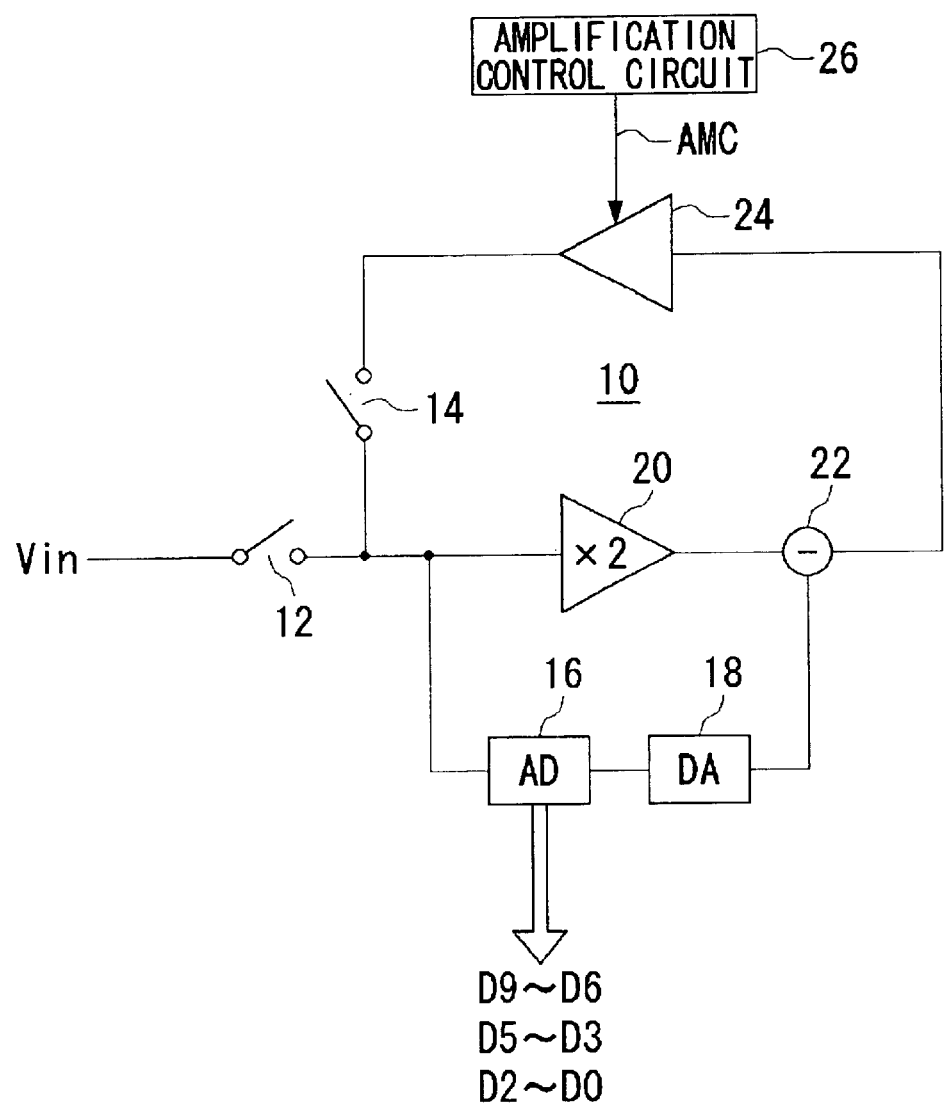
FIG. 1 is a diagram showing the configuration of an AD converter according to a first embodiment of a first group.

FIG. 1 shows the configuration of the AD converter according to the first embodiment of the first group. In the AD converter 10, an input analog signal Vin is input to a sample-and-hold circuit 20 and an AD conversion circuit 16 through a first switch 12. The AD conversion circuit 16 converts the input analog signal into a maximum of four bits of digital value for output. A DA conversion circuit 18 converts the 4-bit maximum digital value output from the AD conversion circuit 16 into an analog signal. The sample-and-hold circuit 20 is a circuit which samples and holds the input analog signal with a gain of 2. A subtractor circuit 22 outputs the difference between the analog value output from the DA conversion circuit 18 and the analog value held in the sample-and-hold circuit 20. An amplifier circuit 24 is a circuit which amplifies the output of the subtractor circuit 22 and feeds back the resultant to the sample-and-hold circuit 20 and the AD conversion circuit 16, with a variable gain. An amplification control circuit 26 controls the gain of the amplifier circuit 24 by using an amplification switch signal AMC. The output of the amplifier circuit 24 is fed back through a second switch 14. The AD conversion circuit 16 converts the fed-back analog value into a 3-bit digital value for output.

The number of times of the cyclic processing through the feedback of the amplifier circuit 24 is three. In an initial stage or the first stage, the first switch 12 is turned on and the second switch 14 off. The AD conversion circuit 16 generates the values of, in descending order, the first to fourth bits (D9–D6) of a 10-bit digital value for the AD converter 10 to output eventually. In the second and third stages, the first switch 12 is turned off and the second switch 14 on. The AD conversion circuit 16 generates the values of, in descending order, the fifth to seventh bits (D5–D3) and the values of the eighth to tenth bits (D2–D0) of the final 10-bit digital value. Of these three stages of AD conversion, the stages for converting upper bits require higher conversion accuracies. The amplification control circuit 26 thus makes the gain of the amplifier circuit 24 lower in the first stage than in the second and third stages so that the settling time is shortened for a higher conversion accuracy.

Figure 2:
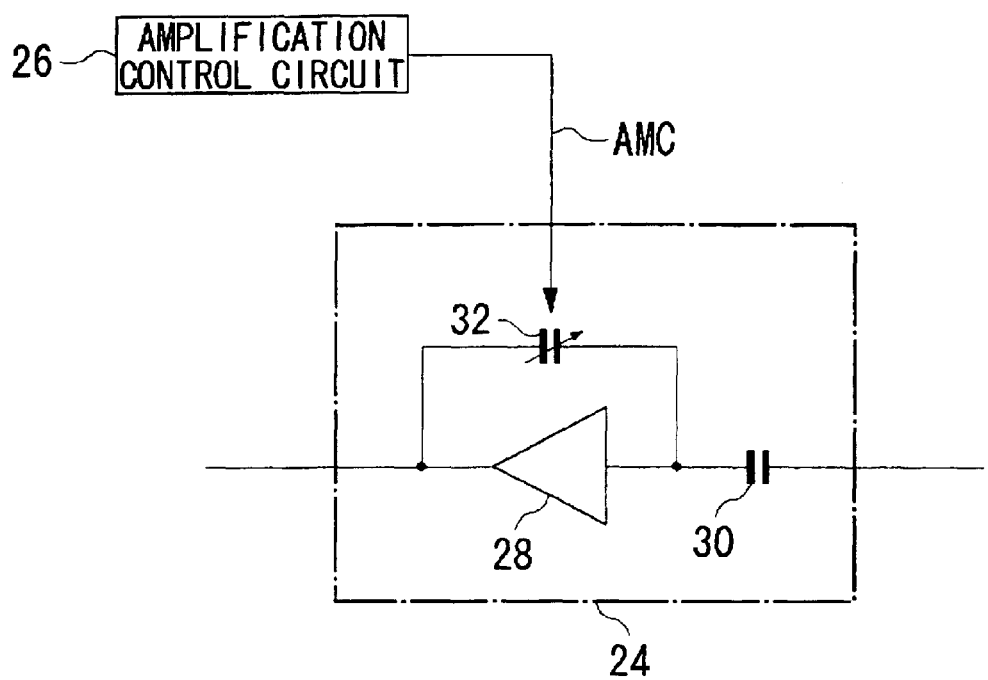
FIG. 2 is a diagram showing an amplification control circuit and the detailed configuration of an amplifier circuit according to the first embodiment of the first group.

FIG. 2 shows the amplification control circuit 26 and the detailed configuration of the amplifier circuit 24. The amplifier circuit 24 chiefly includes an operational amplifier 28, a first capacitor 30, and a second capacitor 32. The first capacitor 30 is situated on the input side of the operational amplifier 28, and has a fixed capacitance. The second capacitor 32 is situated across the input and output of the operational amplifier 28, and has a variable capacitance. The capacitance of the second capacitor 32 is switched by the amplification switch signal AMC which is output from the amplification control circuit 26. The gain of the amplifier circuit 24 is given by C1/C2, where C1 is the capacitance of the first capacitor 30 and C2 is the capacitance of the second capacitor 32. In the present embodiment, the gain of the amplifier circuit 24 is switched between 2 and 4. The second capacitor 32 is thus configured to provide two possible capacitance settings. For example, the second capacitor 32 may be composed of two capacitors which have the same capacitance and are connected in parallel via a switch. In that case, the number of capacitors in connection is changed by the switch, which is controlled on/off by the amplification switch signal AMC.

Figure 3:
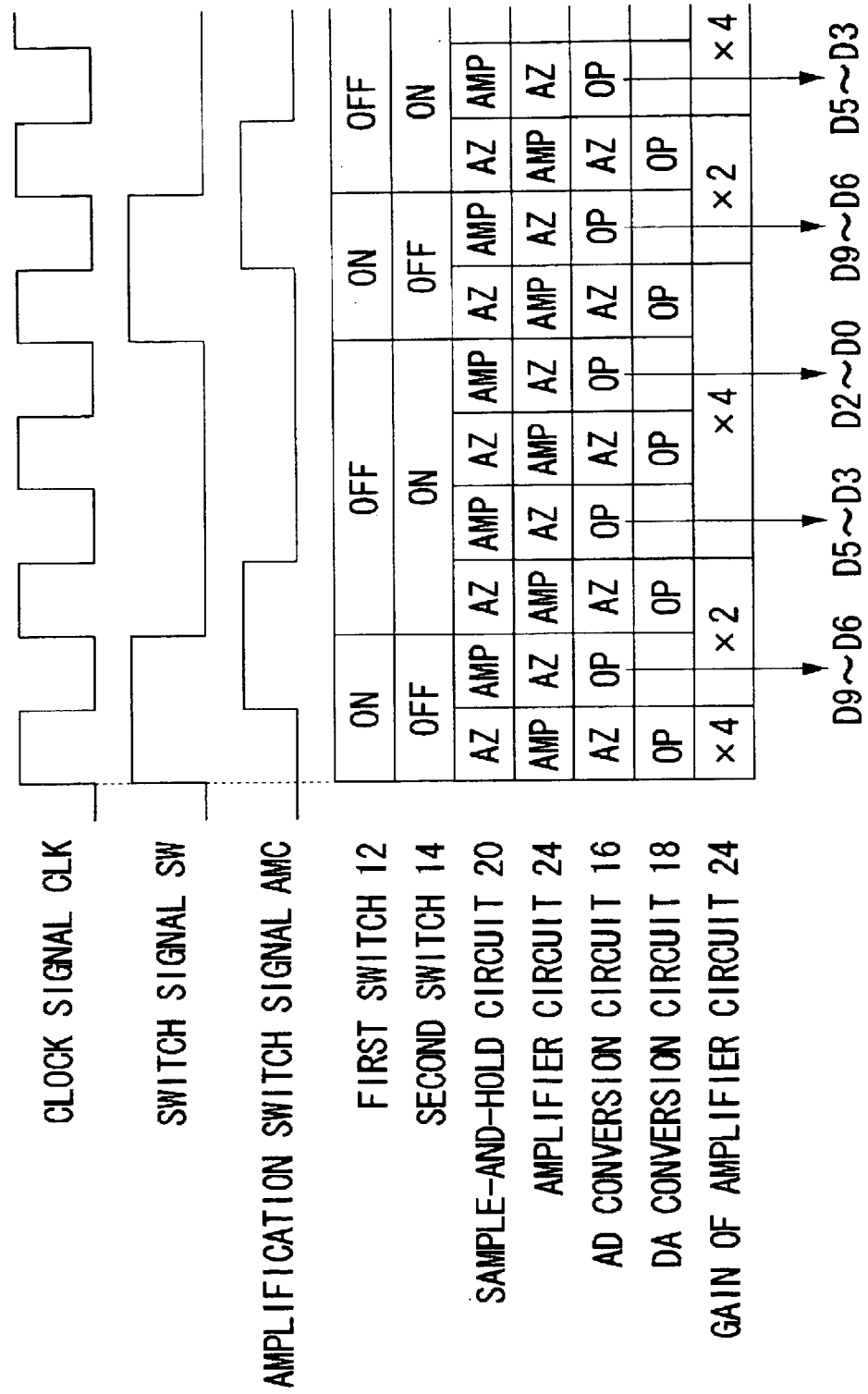
FIG. 3 is a timing chart showing the process of operation of the AD converter according to the first embodiment of the first group.

FIG. 3 is a timing chart showing the process of operation of the AD converter 10. Hereinafter, description will be given in due course from the top of the chart. The three signal waveforms show a clock signal CLK, a switch signal SW, and the amplification switch signal AMC. The clock signal CLK controls the operation of the sample-and-hold circuit 20, the amplifier circuit 24, the AD conversion circuit 16, and the DA conversion circuit 18. The switch signal SW controls on/off status of the first switch 12 and the second switch 14. The amplification switch signal AMC controls the capacitance of the second capacitor 32 in order to change the gain of the amplifier circuit 24.

The clock signal CLK has a frequency three times that of the switch signal SW. The switch signal SW rises in synchronization with a rise of the clock signal CLK. The next fall thereof is in synchronization with the next rise of the clock signal CLK. The amplification switch signal AMC has the same period and the same pulsed waveform as those of the switch signal SW, whereas it lags behind the clock signal CLK in phase by one half of the period.

The first switch 12 is turned on when the switch signal SW is high, and turned off when the switch signal SW is low. The second switch 14 is turned on when the switch signal SW is low, and turned off when the switch signal SW is high. The sample-and-hold circuit 20 amplifies the input analog signal when the clock signal CLK is low, and makes an auto-zero operation when the clock signal CLK is high. The amplifier circuit 24 amplifies the input analog signal when the clock signal CLK is high, and makes an auto-zero operation when the clock signal CLK is low. The AD conversion circuit 16 performs AD conversion when the clock signal CLK is low, and makes an auto-zero operation when the clock signal CLK is high. The DA conversion circuit 18 performs DA conversion when the clock signal CLK is high, and becomes floating when the clock signal CLK is low. Under the control of the amplification control circuit 26, the amplifier circuit 24 provides a gain of 2 when the amplification switch signal AMC is high, and a gain of 4 when the amplification switch signal AMC is low.

As above, the AD converter 10 of the present embodiment decreases the gain of the amplifier circuit 24 when in the first stage, or the initial stage of the course of cyclic processing, and increases the gain of the amplifier circuit 24 when proceeding to the second and third stages. It is therefore possible to avoid deterioration in conversion accuracy at the first stage.

(Second Embodiment)

An AD converter of the present embodiment has almost the same configuration as that of the AD converter 10 according to the first embodiment of the first group. There is a difference, however, in that a power control circuit is provided instead of the amplification control circuit 26 in the first embodiment of the first group. This power control circuit controls the power to be supplied to the sample-and-hold circuit and the amplifier circuit.

Figure 4:
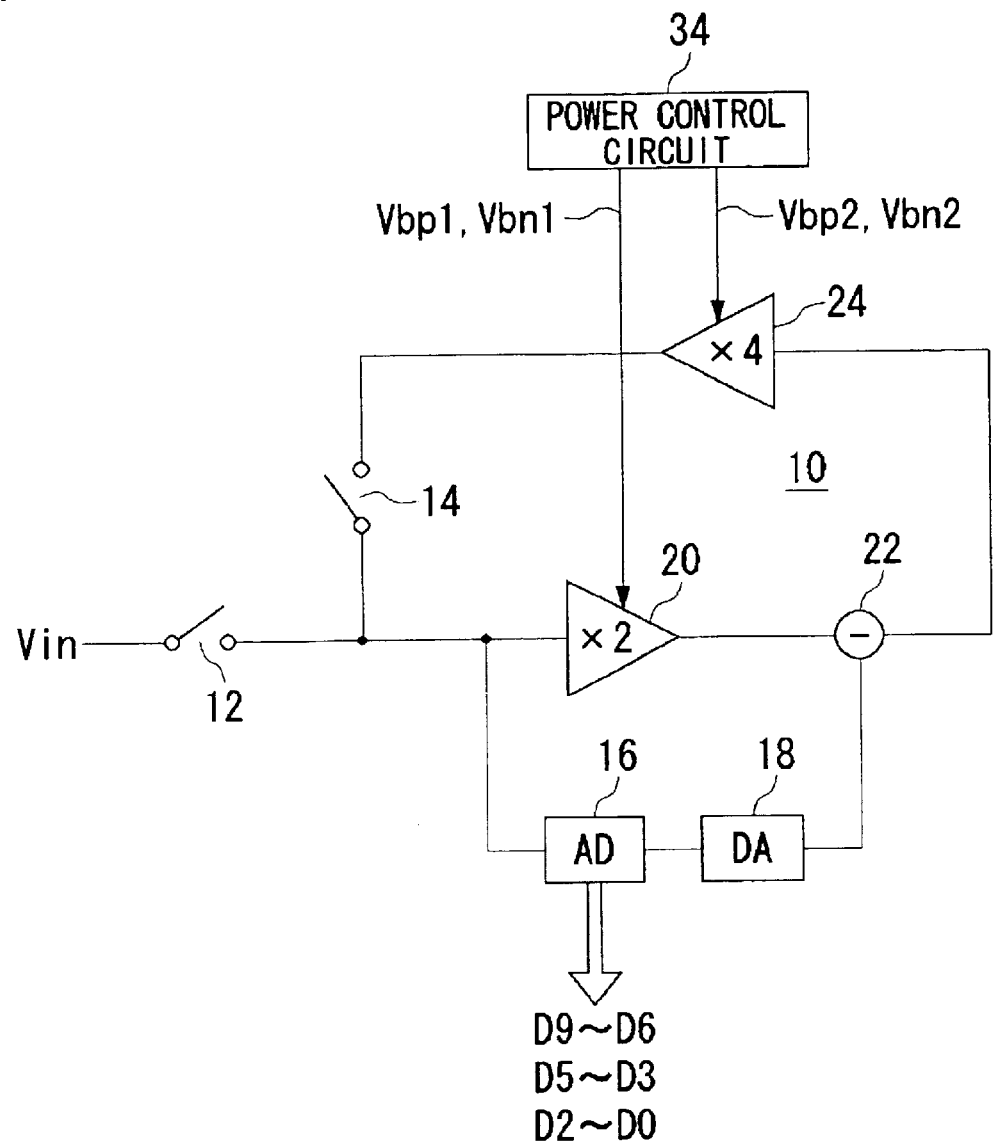
FIG. 4 is a diagram showing the configuration of the AD converter according to a second embodiment of the first group.

FIG. 4 shows the configuration of the AD converter according to the second embodiment of the first group. In the AD converter 10, the first switch 12, the second switch 14, the AD conversion circuit 16, the DA conversion circuit 18, the sample-and-hold circuit 20, the subtractor circuit 22, and the amplifier circuit 24 have almost the same configuration as that of the components according to the first embodiment of the first group shown in FIG. 1 to which the same names and numerals are given, respectively. Note that the power supplied to the sample-and-hold circuit 20 and the amplifier circuit 24 is controlled by the power control circuit 34. Specifically, the power control circuit 34 maximizes the currents that flow during amplification of the first stage, and gradually decreases the currents when proceeding to the second and third stages. For the sake of such control, the power control circuit 34 sends a first current switch signal Vbp1 and a second current switch signal Vbn1 to the sample-and-hold circuit 20, and a third current switch signal Vbp2 and a fourth current switch signal Vbn2 to the amplifier circuit 24.

Figure 5:
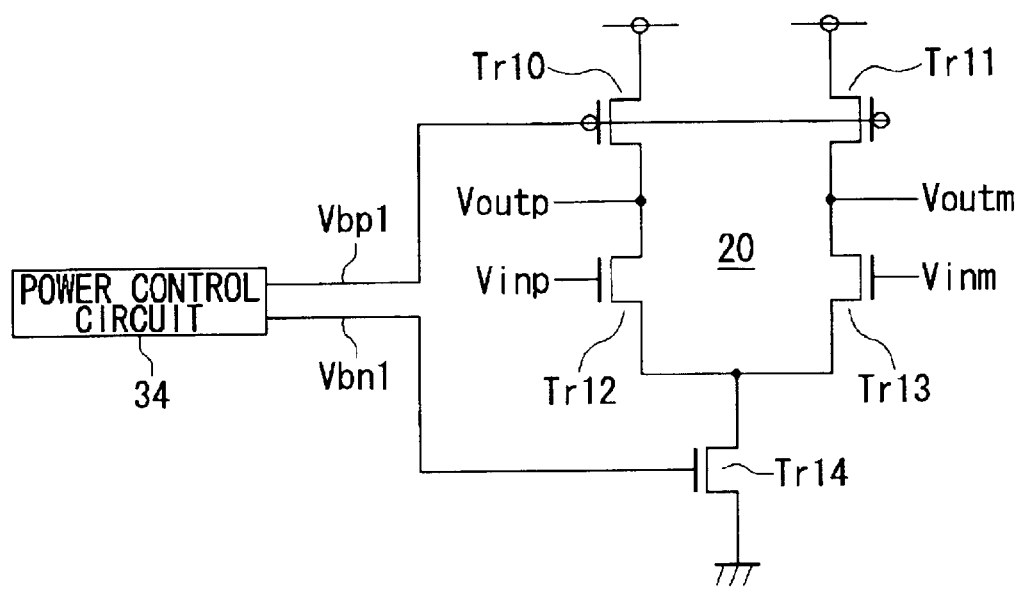
FIG. 5 is a diagram showing a power control circuit and the detailed configuration of a sample-and-hold circuit according to the second embodiment of the first group.

FIG. 5 shows the power control circuit 34 and the detailed configuration of the sample-and-hold circuit 20. The sample-and-hold circuit 20 is a differential amplifier circuit, chiefly including a first transistor Tr10, a second transistor Tr11, a third transistor Tr12, a fourth transistor Tr13, and a fifth transistor Tr14. The first transistor Tr10 and the second transistor Tr11 are p-channel MOS transistors. The third transistor Tr12, the fourth transistor Tr13, and the fifth transistor Tr14 are n-channel MOS transistors.

The first transistor Tr10 and the third transistor Tr12 are connected in series. The first transistor Tr10 is connected at its source to a current source, and at its drain to the drain of the third transistor Tr12. The source of the third transistor Tr12 is connected to the drain of the fifth transistor Tr14. The second transistor Tr11 and the fourth transistor Tr13 are also connected in series. The second transistor Tr11 is connected at its source to the current source, and at its drain to the drain of the fourth transistor Tr13. The source of the fourth transistor Tr13 is connected to the drain of the fifth transistor Tr14. The source of the fifth transistor Tr14 is grounded.

The first transistor Tr10 and the second transistor Tr11 receive the first current switch signal Vbp1 at their respective gates. The drains of the transistors Tr10 and Tr11 make output terminals Voutp and Voutm of the sample-and-hold circuit 20, respectively. The gates of the third transistor Tr12 and the fourth transistor Tr13 make input terminals Vinp and Vinm of the sample-and-hold circuit 20, respectively. The gate of the fifth transistor Tr14 receives the second current switch signal Vbn1. Here, in the first stage, the first current switch signal Vbp1 is made smaller and the second current switch signal Vbn1 greater in value. This increases the currents flowing between the input terminal Vinp and the output terminal Voutp, and between the input terminal Vinm and the output terminal Voutm. In the second and third stages, the first current switch signal Vbp1 is made greater and the second current switch signal Vbn1 smaller in value. This decreases the currents flowing between the input terminal Vinp and the output terminal Voutp, and between the input terminal Vinm and the output terminal Voutm.

It should be noted that the amplifier circuit 24 has the same internal configuration as that of the sample-and-hold circuit 20. The third current switch signal Vbp2 and the fourth current switch signal Vbn2 input to the amplifier circuit 24 operate like the first current switch signal Vbp1 and the second current switch signal Vbn1 input to the sample-and-hold circuit 20 do, respectively.

Figure 6:
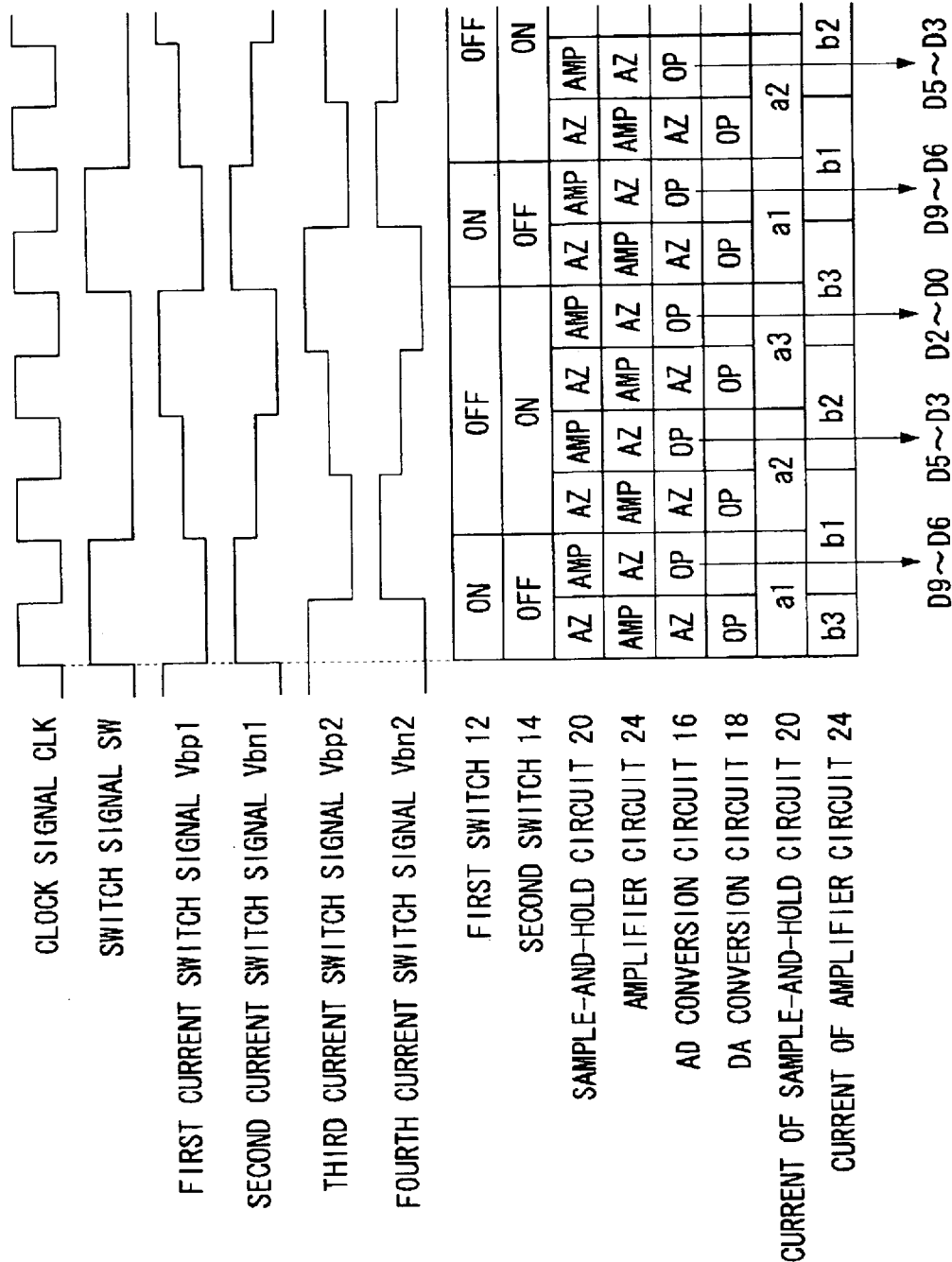
FIG. 6 is a timing chart showing the process of operation of the AD converter according to the second embodiment of the first group.

FIG. 6 is a timing chart showing the process of operation of the AD converter 10. Hereinafter, description will be given in due course from the top of the chart. The six signal waveforms show the clock signal CLK, the switch signal SW, the first current switch signal Vbp1, the second current switch signal Vbn1, the third current switch signal Vbp2, and the fourth current switch signal Vbn2. The clock signal CLK and the switch signal SW have totally the same frequencies, periods, and waveforms as those of the clock signal CLK and the switch signal SW according to the first embodiment of the first group.

The first current switch signal Vbp1, the second current switch signal Vbn1, the third current switch signal Vbp2, and the fourth current switch signal Vbn2 each have as long a period as three periods of the clock signal CLK like the switch signal SW. The first current switch signal Vbp1 falls to its minimum value in synchronization with a rise of the clock signal CLK. Then, it rises to an intermediate value at the next rise of the clock signal CLK, and reaches its maximum value at the still next rise of the clock signal CLK. On the other hand, the second current switch signal Vbn1 has a pulsed waveform inverse to that of the first current switch signal Vbp1. The second current switch signal Vbn1 reaches its maximum value in synchronization with the rise of the clock signal CLK. Then, it falls to an intermediate value at the next rise of the clock signal CLK, and falls to its minimum value at the still next rise of the clock signal CLK. The third current switch signal Vbp2 has the same pulsed waveform as that of the first current switch signal Vbp1, and lags behind the first current switch signal Vbp1 in phase by one half the period of the clock signal CLK. The fourth current switch signal Vbn2 has the same pulsed waveform as that of the second current switch signal Vbn1, and lags behind the second current switch signal Vbn1 in phase by one half the period of the clock signal CLK.

The first switch 12, the second switch 14, the sample-and-hold circuit 20, the amplifier circuit 24, the AD conversion circuit 16, and the DA conversion circuit 18 operate at the same timing as with those components of the first embodiment of the first group shown in FIG. 3 to which the same names and numerals are given, respectively. Here, during the period in which the first current switch signal Vbp1 has the minimum value, i.e., during the period in which the second current switch signal Vbn1 has the maximum value, the current of the sample-and-hold circuit 20 shows a maximum value of a1. During the period in which the first current switch signal Vbp1 and the second current switch signal Vbn1 have their respective intermediate values, the current of the sample-and-hold circuit 20 shows an intermediate value of a2. During the period in which the first current switch signal Vbp1 has the maximum value, i.e., during the period in which the second current switch signal Vbn1 has the minimum value, the current of the sample-and-hold circuit 20 shows a minimum value of a3. The same holds for the amplifier circuit 24. That is, during the period in which the third current switch signal Vbp2 has the minimum value, i.e., during the period in which the fourth current switch signal Vbn2 has the maximum value, the current of the amplifier circuit 24 shows a maximum value of b1. During the period in which the third current switch signal Vbp2 and the fourth current switch signal Vbn2 have their respective intermediate values, the current of the amplifier circuit 24 also shows an intermediate value of b2. During the period in which the third current switch signal Vbp2 has the maximum value, i.e., during the period in which the fourth current switch signal Vbn2 has the minimum value, the current of the amplifier circuit 24 shows a minimum value of b3.

As above, the AD converter 10 of the present embodiment increases the power supply in the first stage, or the initial stage of the course of the cyclic processing, by increasing the currents that flow through the sample-and-hold circuit 20 and the amplifier circuit 24 in the first stage. This makes it possible to secure necessary throughput while maintaining the processing time unchanged. In the second and subsequent stages, the currents flowing through the sample-and-hold circuit 20 and the amplifier circuit 24 can be reduced gradually in accordance with the progress of the circulation, for the sake of power saving.

(Third Embodiment)

An AD converter of the present embodiment has almost the same configuration as that of the AD converters according to the first and second embodiments of the first group. There is a difference, however, in that a clock control circuit is provided instead of the amplification control circuit 26 in the first embodiment of the first group or the power control circuit 34 in the second embodiment of the first group. This clock control circuit controls the pulse width of the clock signal to be input to the circuits.

Figure 7:
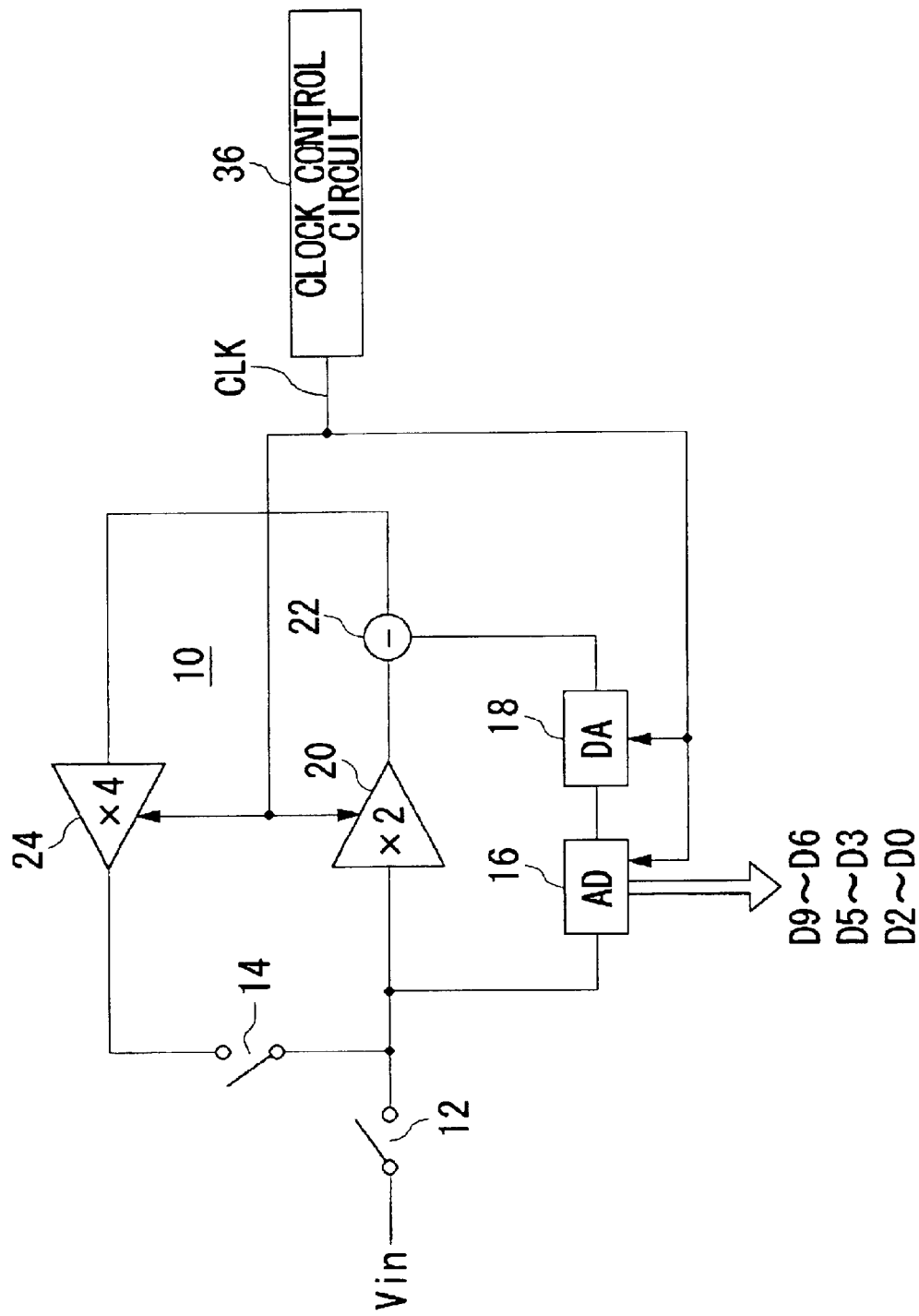
FIG. 7 is a diagram showing the configuration of the AD converter according to a third embodiment of the first group.

FIG. 7 shows the configuration of the AD converter according to the third embodiment of the first group. In the AD converter 10, the first switch 12, the second switch 14, the AD conversion circuit 16, the DA conversion circuit 18, the sample-and-hold circuit 20, the subtractor circuit 22, and the amplifier circuit 24 have almost the same configuration as that of the components according to the first embodiment shown in FIG. 1 to which the same names and numerals are given, respectively. Note that the pulse width of the clock signal CLK to be input to the AD conversion circuit 16, the DA conversion circuit 18, the sample-and-hold circuit 20, and the amplifier circuit 24 is controlled by a clock control circuit 36. The pulse width of this clock signal CLK is controlled in accordance with the progress of the cyclic processing in the AD converter 10. Specifically, in the first stage, the clock control circuit 36 maximizes the pulse width during the period when the clock signal CLK is high. It reduces the pulse width gradually when proceeding to the second and third stages.

Figure 8:
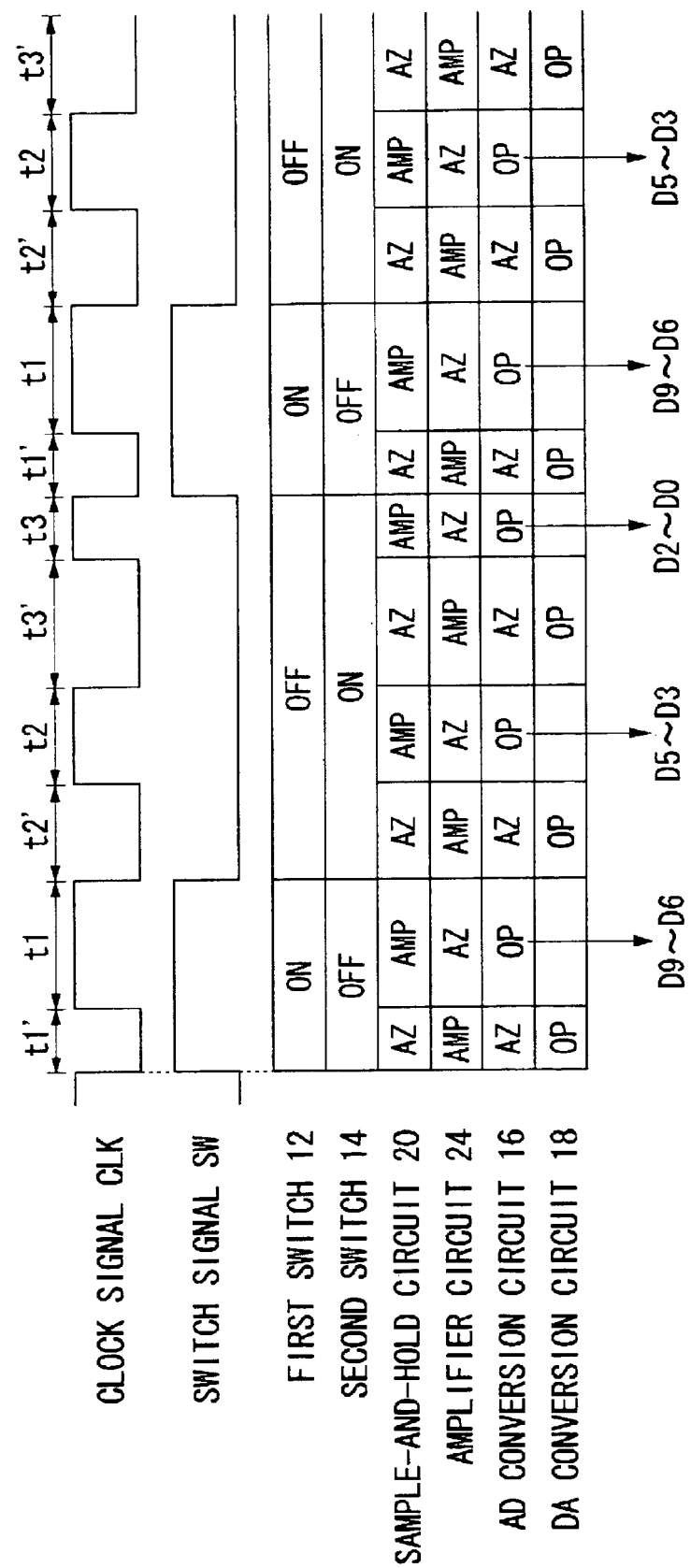
FIG. 8 is a timing chart showing the process of operation of the AD converter according to the third embodiment of the first group.

FIG. 8 is a timing chart showing the process of operation of the AD converter 10. Hereinafter, description will be given in due course from the top of the chart. The two signal waveforms show the clock signal CLK and the switch signal SW. The high time and low time of the clock signal CLK vary while maintaining the period unchanged. In the first stage, the high time t1 is longer than the low time t1'. In the second stage, the high time t2 and the low time t2' are the same. In the third stage, the high time t3 is shorter than the low time t3'. The switch signal SW has a period three times that of the clock signal CLK. The duration between the first rise and fall is equivalent to a single period of the clock signal CLK.

The first switch 12 is turned on when the switch signal SW is high, and turned off when the switch signal SW is low. The second switch 14 is turned on when the switch signal SW is low, and turned off when the switch signal SW is high. The sample-and-hold circuit 20 amplifies the input analog signal when the clock signal CLK is low, and makes an auto-zero operation when the clock signal CLK is high. The amplifier circuit 24 amplifies the input analog signal when the clock signal CLK is high, and makes an auto-zero operation when the clock signal CLK is low. The AD conversion circuit 16 performs AD conversion when the clock signal CLK is low, and makes an auto-zero operation when the clock signal CLK is high. The DA conversion circuit 18 performs DA conversion when the clock signal CLK is high, and becomes floating when the clock signal CLK is low.

As above, the pulse width of the clock signal CLK is controlled in accordance with the progress of the cyclic processing. In particular, in the first stage or the initial stage, the pulse width is increased while the clock signal CLK is high. Since the processing time of the AD conversion by the AD conversion circuit 16 is thus increased, it is possible to make the conversion accuracy of the upper bits higher than that of the lower bits. In the second and subsequent stages, the processing time of the AD conversion can be gradually reduced for power saving.

(Fourth Embodiment)

An AD converter of the present embodiment has almost the same configuration as that of the AD converters according to the first to third embodiments of the first group. There is a difference, however, in that a capacitance control circuit is provided instead of the amplification control circuit 26 according to the first embodiment, the power control circuit 34 according to the second embodiment, and the clock control circuit 36 according to the third embodiment. This capacitance control circuit controls the capacitances included in the sample-and-hold circuit and the amplifier circuit.

Figure 9:
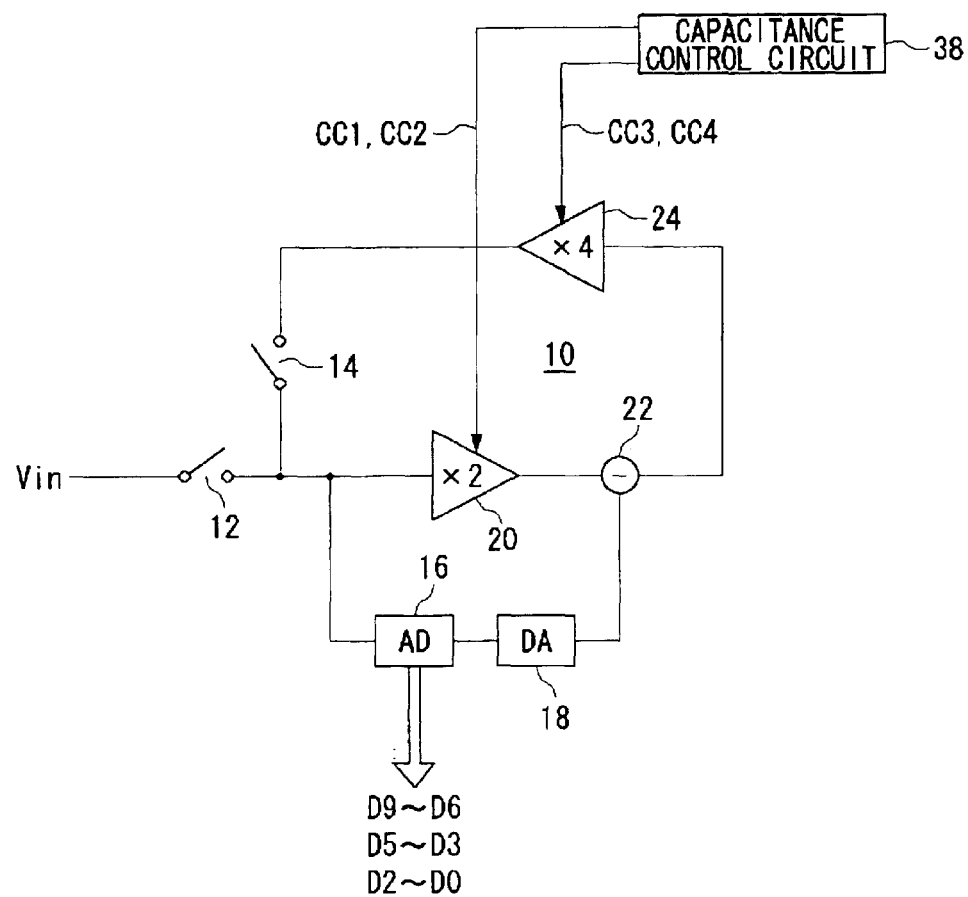
FIG. 9 is a diagram showing the configuration of the AD converter according to a fourth embodiment of the first group.

FIG. 9 shows the configuration of the AD converter according to the fourth embodiment of the first group. In the AD converter 10, the first switch 12, the second switch 14, the AD conversion circuit 16, the DA conversion circuit 18, and the subtractor circuit 22 have almost the same configuration as that of the components according to the first embodiment shown in FIG. 1 to which the same names and numerals are given, respectively. Meanwhile, the capacitances included in the sample-and-hold circuit 20 and the amplifier circuit 24 are controlled by a first capacitance switch signal CC1 a second capacitance switch signal CC2, a third capacitance switch signal CC3, and a fourth capacitance switch signal CC4 which are output from the capacitance control circuit 38. The capacitance control circuit 38 maximizes the capacitances of both the sample-and-hold circuit 20 and the amplifier circuit 24 in the first stage, and gradually decreases the capacitances when proceeding to the second and subsequent stages.

Figure 10:
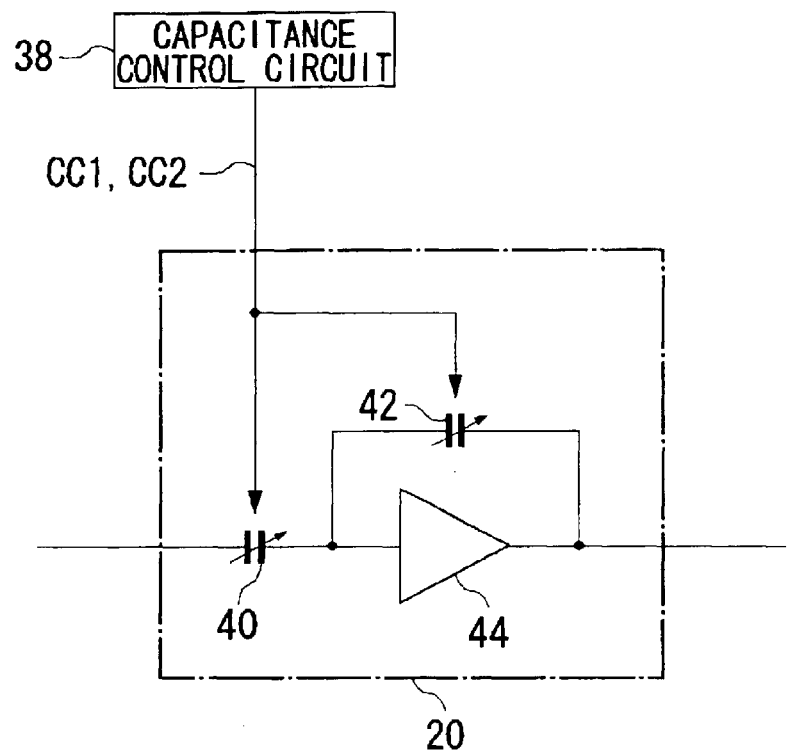
FIG. 10 is a diagram showing a capacitance control circuit and the detailed configuration of a sample-and-hold circuit according to the fourth embodiment of the first group.

FIG. 10 shows the capacitance control circuit 38 and the detailed configuration of the sample-and-hold circuit 20. The sample-and-hold circuit 20 chiefly includes a first capacitor 40, a second capacitor 42, and a first operational amplifier 44. The first capacitor 40 is situated on the input side of the first operational amplifier 44. The second capacitor 42 is situated across the input and output of the first operational amplifier 44. To double the gain of the sample-and-hold circuit 20, the first capacitor 40 is composed of six capacitors having the same capacitance, which are connected in parallel via switches. The second capacitor 42 is composed of three capacitors having the same capacitance, which are connected in parallel via switches. Assuming that these nine capacitors have a capacitance of 1C each, the first capacitor 40 has a capacitance of 6C and the second capacitor 42 a capacitance of 3c in the first stage. The gain of the sample-and-hold circuit 20 is 6C/3C=2. To reduce the capacitances while maintaining the gain unchanged, it is only necessary to reduce the capacitance of the first capacitor 40 and the capacitance of the second capacitor 42 while maintaining the ratio therebetween. For example, in the second stage, the first capacitor 40 is given a capacitance of 4C and the second capacitor 42 a capacitance of 2C. In the third stage, the first capacitor 40 is given a capacitance of 2C and the second capacitor 42 a capacitance of 1C. The capacitances are thus reduced gradually based on the first capacitance switch signal CC1 and the second capacitance switch signal CC2.

Figure 11:
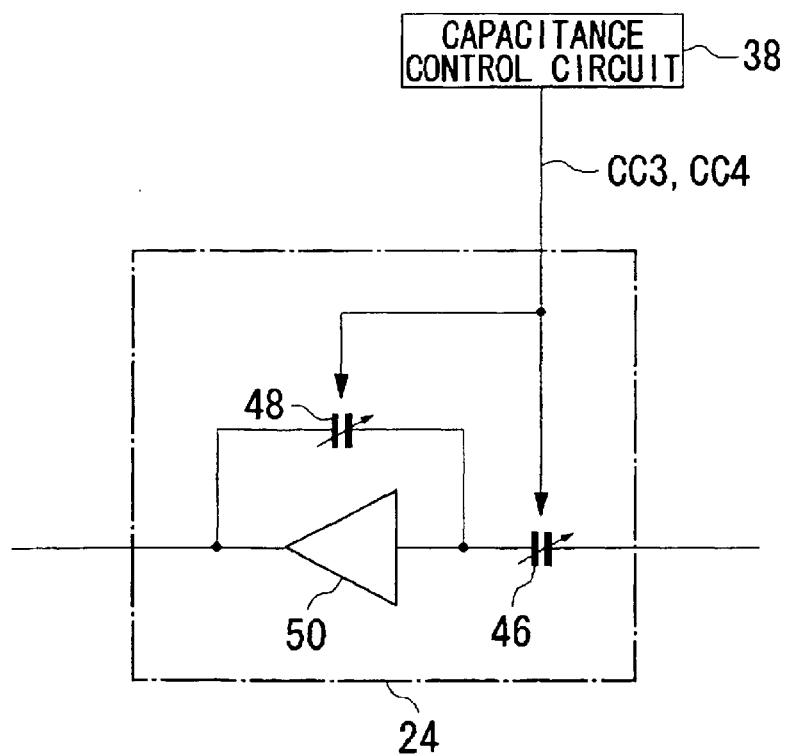
FIG. 11 is a diagram showing the capacitance control circuit and the detailed configuration of an amplifier circuit according to the fourth embodiment of the first group.

FIG. 11 shows the capacitance control circuit 38 and the detailed configuration of the amplifier circuit 24. The amplifier circuit 24 chiefly includes a third capacitor 46, a fourth capacitor 48, and a second operational amplifier 50. The third capacitor 46 is situated on the input side of the second operational amplifier 50. The fourth capacitor 48 is situated across the input and output of the second operational amplifier 50. To quadruple the gain of the amplifier circuit 24, the third capacitor 46 is composed of twelve capacitors having the same capacitance, which are connected in parallel via switches. The fourth capacitor 48 is composed of three capacitors having the same capacitance, which are connected in parallel via switches. Assuming that these fifteen capacitors have a capacitance of 1C each, the third capacitor 46 has a capacitance of 12C and the fourth capacitor 42 a capacitance of 3c in the first stage. The gain of the amplifier circuit 24 is 12C/3C=4. To reduce the capacitances while maintaining the gain unchanged, it is only necessary to reduce the capacitance of the third capacitor 46 and the capacitance of the fourth capacitor 48 while maintaining the ratio therebetween. For example, in the second stage, the third capacitor 46 is given a capacitance of 8C and the fourth capacitor 42 a capacitance of 2C. In the third stage, the third capacitor 46 is given a capacitance of 4C and the fourth capacitor 42 a capacitance of 1C. The capacitances are thus reduced gradually based on the third capacitance switch signal CC3 and the fourth capacitance switch signal CC4.

Figure 12:
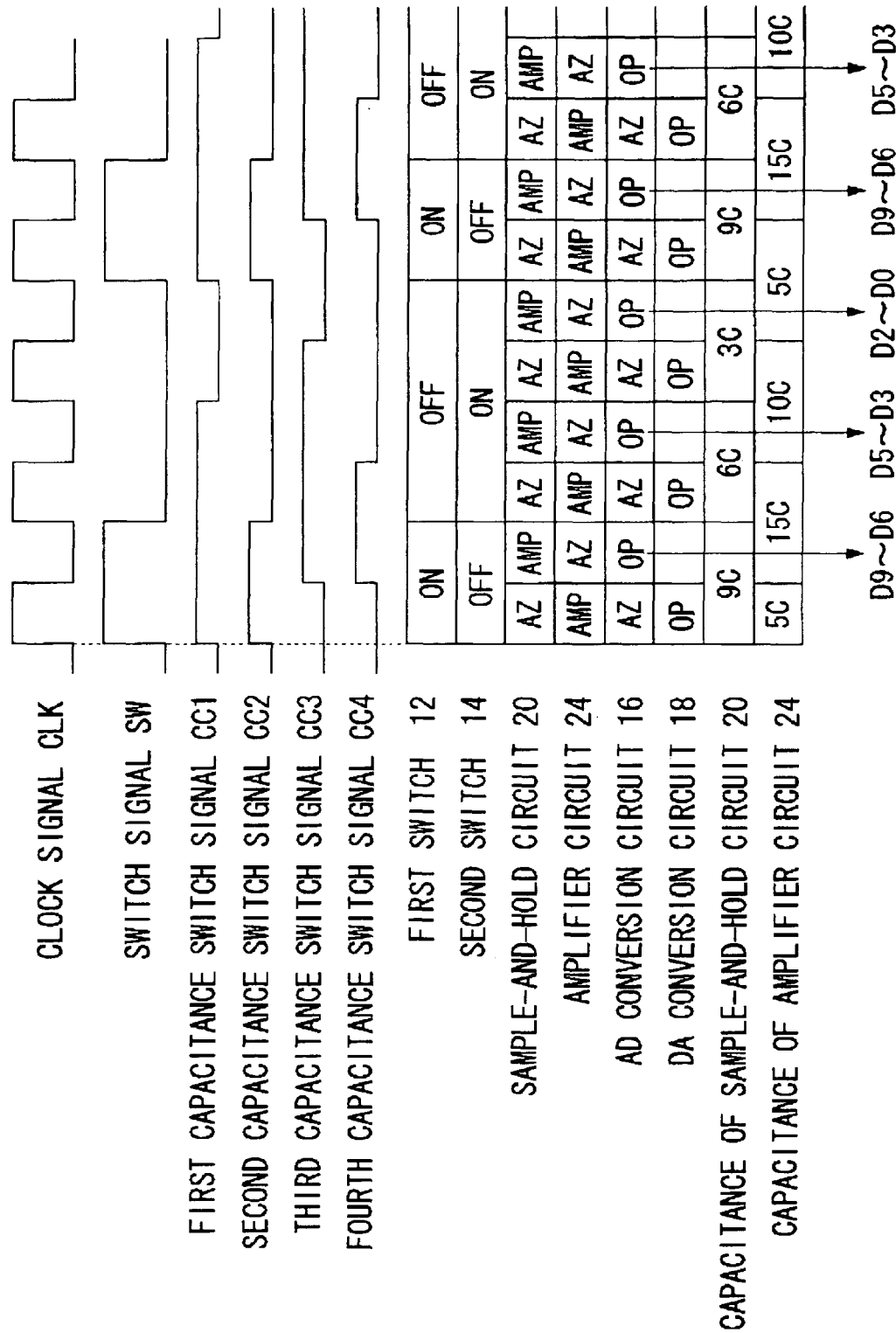
FIG. 12 is a timing chart showing the process of operation of the AD converter according to the fourth embodiment of the first group.
Figure 13:
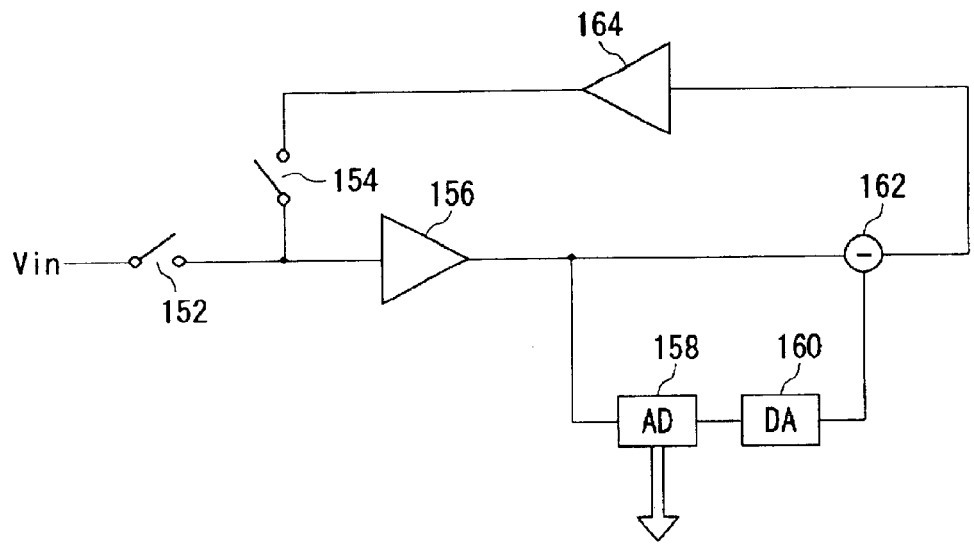
FIG. 13 is a diagram showing the configuration of a conventional cyclic AD converter of the first group.

FIG. 12 is a timing chart showing the process of operation of the AD converter 10. Hereinafter, description will be given in due course from the top of the chart. The six signal waveforms show the clock signal CLK, the switch signal SW, the first capacitance switch signal CC1, the second capacitance switch signal CC2, the third capacitance switch signal CC3, and the fourth capacitance switch signal CC4. The clock signal CLK and the switch signal SW have totally the same frequencies, periods, and waveforms as those of the clock signal CLK and the switch signal SW according to the first embodiment. The first to fourth capacitance switch signals CC1 to CC4 each have the same period as that of the switch signal SW, or is equivalent to three periods of the clock signal CLK. The first capacitance switch signal CC1 rises in synchronization with a rise of the clock signal CLK. The high time thereof is equivalent to two periods of the clock signal CLK. The second capacitance switch signal CC2 rises in synchronization with the rise of the clock signal CLK. The high time thereof is equivalent to a single period of the clock signal CLK. The third capacitance switch signal CC3 rises with a lag behind the rise of the first capacitance switch signal CC1 by one half the period of the clock signal CLK. The high time thereof is equivalent to two periods of the clock signal CLK. The fourth capacitance switch signal CC4 rises in synchronization with the rise of the third capacitance switch signal CC3. The high time thereof is equivalent to a single period of the clock signal CLK.

The first switch 12, the second switch 14, the sample-and-hold circuit 20, the amplifier circuit 24, the AD conversion circuit 16, and the DA conversion circuit 18 operate at the same timing as with those components of the first embodiment shown in FIG. 3 to which the same names and numerals are given, respectively. The sample-and-hold circuit 20 has a capacitance of 6C+3C=9C during the period where the first capacitance switch signal CC1 and the second capacitance switch signal CC2 both are high. During the period where the first capacitance switch signal CC1 is high and the second capacitance switch signal CC2 is low, the capacitance is 4C+2C=6C. During the period where the first capacitance switch signal CC1 and the second capacitance switch signal CC2 both are low, the capacitance is 2C+1C=3C. The amplifier circuit 24 has a capacitance of 12C+3C=15C during the period where the third capacitance switch signal CC3 and the fourth capacitance switch signal CC4 both are high. During the period where the third capacitance switch signal CC3 is high and the fourth capacitance switch signal CC4 is low, the capacitance is 8C+2C=1C. During the period where the third capacitance switch signal CC3 and the fourth capacitance switch signal CC4 both are low, the capacitance is 4C+1C=5C.

As above, the AD converter 10 of the present embodiment gradually decreases the capacitances of the sample-and-hold circuit 20 and the amplifier circuit 24 with the progress of the cyclic processing. In the first stage or initial stage where a relatively high conversion accuracy is required, the sample-and-hold circuit 20 and the amplifier circuit 24 are given larger capacitances so that the influence of thermal noise and the like is reduced for an increase in conversion accuracy. In the second and third stages where the conversion accuracies required are not as high as in the first stage, the capacitances of the sample-and-hold circuit 20 and the amplifier circuit 24 are reduced gradually for power saving.

Up to this point, description has been given of the embodiments in the first group of the present invention. These embodiments are given solely by way of illustration. It will be understood by those skilled in the art that various modifications may be made of combinations of the foregoing components and processes, and all such modifications are also intended to fall within the scope of the present invention. The following provides some of the modifications of the first group.

In the embodiments of the first group, the subtractor circuit and the amplifier circuit which amplifies the output of the subtractor circuit are provided separately. In a modification, these circuits may be integrated as a subtracting amplifier.

In the embodiments of the first group, the parameters including the numbers of bits to be converted by the AD conversion circuit, the allocation thereof, the gains of the amplifier circuits, the clock frequency, the conversion speed, the currents, the pulse widths, and the capacitances are shown solely by way of example. In a modification, other figures may be employed for these parameters.

The second embodiment has dealt with the configuration of changing the power supply by changing the currents. In a modification, voltages may be changed to change the power supply.

(Second Group)
(First Embodiment)

In the present embodiment, the reference voltage range for generating reference voltages of the AD conversion circuit included in an AD converter of cyclic type is changed in accordance with the progress of the cyclic processing. Specifically, the reference voltage range mentioned above is reduced by half at the second and subsequent cycles. This makes it possible to suppress the gain of the amplifier circuit, allowing speedup of the entire AD converter.

Figure 14:
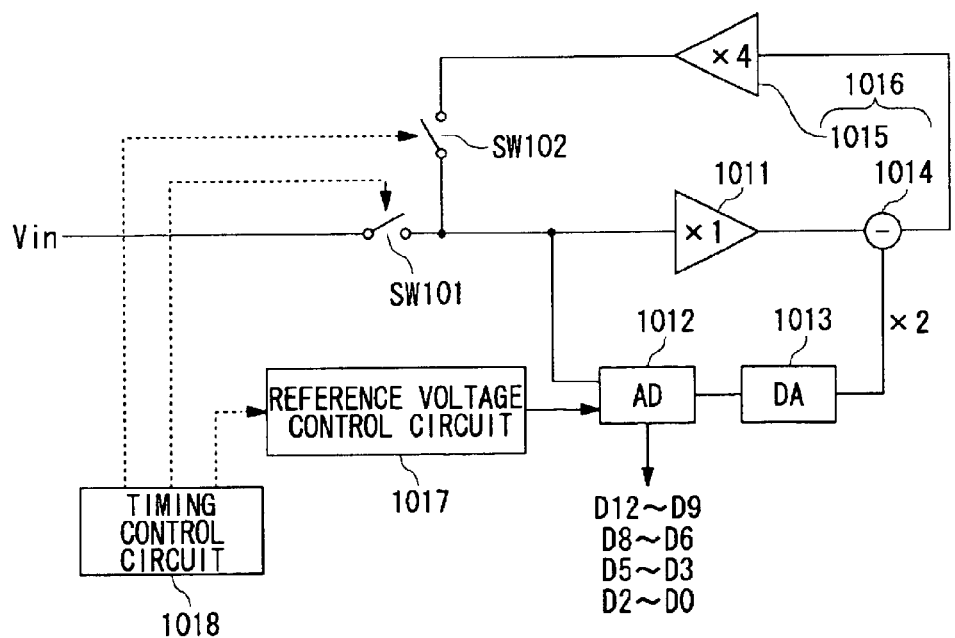
FIG. 14 is a diagram showing the configuration of an AD converter according to a first embodiment of a second group.

FIG. 14 shows the configuration of the AD converter according to a first embodiment of the second group. In the AD converter, an input analog signal Vin is input to a first amplifier circuit 1011 and an AD conversion circuit 1012 through a first switch SW101. The AD conversion circuit 1012 converts the input analog signal into a maximum of four bits of digital value, and outputs the same to a not-shown encoder and a DA conversion circuit 1013. The DA conversion circuit 1013 converts the 4-bit maximum digital value output from the AD conversion circuit 1012 into an analog signal.

The first amplifier circuit 1011 is a circuit which samples and holds the input analog signal. In the present embodiment, the input analog signal is not amplified. A subtractor circuit 1014 subtracts the analog value output from the DA conversion circuit 1013 from the analog value held in the first amplifier circuit 1011. A second amplifier circuit 1015 is a circuit which amplifies the output of the subtractor circuit 1014 and feeds back the resultant to the first amplifier circuit 1011 and the AD conversion circuit 1012, with a gain of 4. Incidentally, the subtractor circuit 1014 and the second amplifier circuit 1015 may be replaced with a subtracting amplifier circuit 1016, an amplifier circuit having a subtracting function. This can simplify the circuitry. A reference voltage control circuit 1017 exercises control so that the reference voltage range of the AD conversion circuit 1012 decreases by half at each cycle. A timing control circuit 1018 controls on/off status of the first switch SW101 and a second switch SW102. It also supplies the reference voltage control circuit 1017 with the timing of each unit cycle.

The output of the second amplifier circuit 1015 is fed back through the second switch SW102. The AD conversion circuit 1012 converts the fed-back analog value into a 3-bit digital value, and outputs the same to the not-shown encoder and the DA conversion circuit 1013.

The number of times of the cyclic processing through the feedback of the second amplifier circuit 1015 is four. At the first cycle, or an initial stage, the first switch SW101 is turned on and the second switch SW102 off. The AD conversion circuit 1012 generates the values of, in descending order, the first to fourth bits (D12–D9) of a 13-bit digital value for the AD converter to output eventually.

At the second to fourth cycles, the first switch SW101 is turned off and the second switch SW102 on. The AD conversion circuit 1012 generates the values of, in descending order, the fifth to seventh bits (D8–D6), the values of the eighth to tenth bits (D5–D3), and the values of the eleventh to thirteenth bits (D2–D0) of the final 13-bit digital value.

Figure 15:
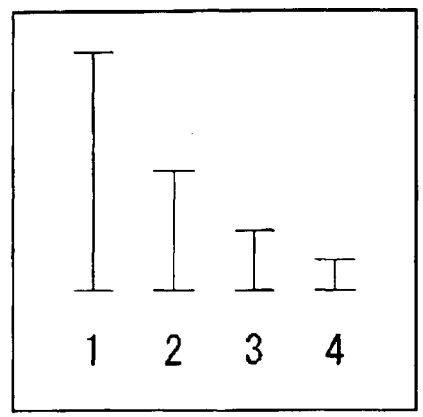
FIG. 15 is a conceptual diagram showing the transition of the reference voltage range for generating the reference voltages of an AC conversion circuit according to the first embodiment of the second group.

FIG. 15 is a conceptual diagram showing the transition of the reference voltage range for generating the reference voltages in each cycle. The reference voltage control circuit 1017 reduces the reference voltage range of the AD conversion circuit 1012 by half at each cycle. Consequently, the reference voltages to be generated at regular intervals based on the reference voltage range also decrease by half at each succeeding cycle.

As above, when the reference voltage range for generating the reference voltages of the AD conversion circuit is reduced by half at each cycle, the gain of the second amplifier circuit 1015 can be set to four, not to eight which has conventionally been required. This can improve the speed of the second amplifier circuit 1015, with an improvement in the speed of the entire AD converter. Since the accuracy required of the AD conversion circuit 1012 decreases at each succeeding cycle, it is possible to reduce the reference voltages at each cycle.

Note that if the reference voltage control circuit 1017 exercises control so that the reference voltage range of the AD conversion circuit 1012 decreases to one quarter at each cycle, the second amplifier circuit 1015 is given a gain of 2.

Figure 16:
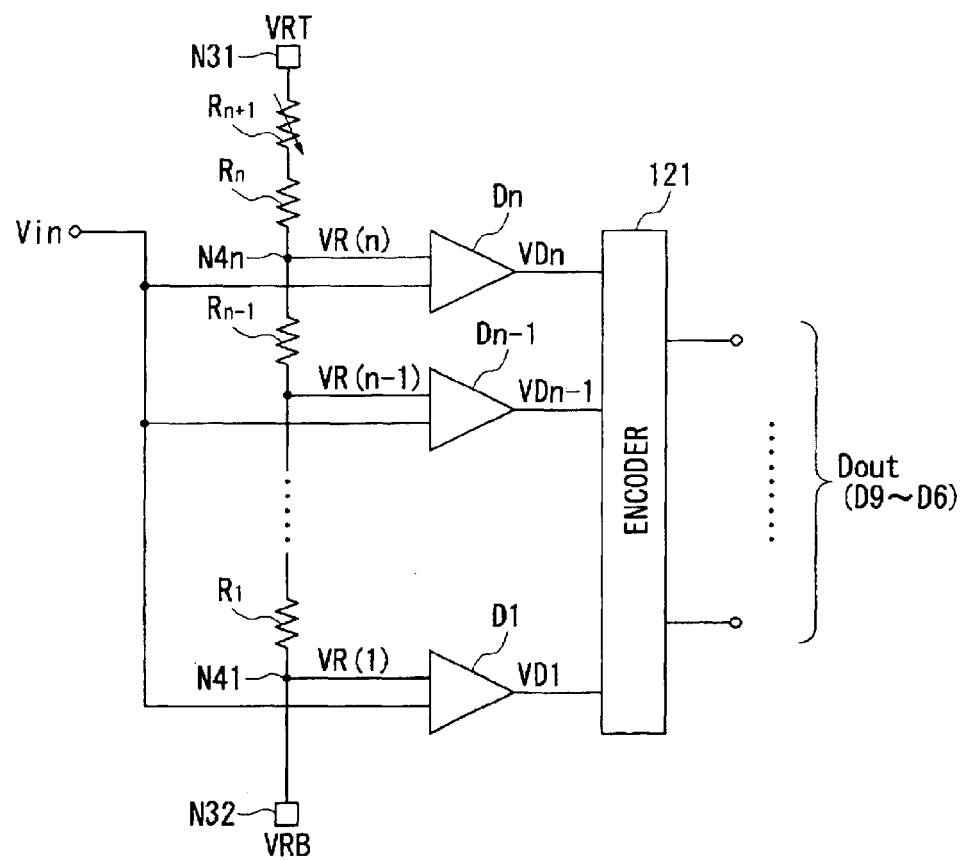
FIG. 16 shows the detailed configuration of the AD conversion circuit. The AD conversion circuit shown in FIG. 16 is of full-parallel comparison, i.e., flash system.

FIG. 16 shows the detailed configuration of the AD conversion circuit. The AD conversion circuit shown in FIG. 16 is of full-parallel comparison, i.e., flash system. In FIG. 16, the AD conversion circuit consists of (n+1) resistors R1 to Rn+1, n voltage comparison devices D1 to Dn, and an encoder 121.

The top resistor Rn+1 is a variable resistor. It increases in resistance at each cycle under the control of the reference voltage control circuit 1017. In the example shown in FIG. 14, the resistance is doubled to reduce the reference voltage range by half at each cycle. Excluding the top resistor Rn+1, the resistors R1 to Rn have the same resistance and generate n reference voltages. Here, n corresponds to the number of bits to output. These resistors R1 to Rn+1 are connected in series between a top-potential node N31 which receives a top-potential reference voltage VRT and a bottom-potential node N32 which receives a bottom-potential reference voltage VRB. Here, the nodes N41 to N4n lying between the n resistors R1 to Rn across the top-potential node N31 and the bottom-potential node N32, excluding the top resistor Rn+1, or between the bottom resistor R1 and the bottom-potential node N32 shall have potentials of VR(1) to VR(n), respectively.

The analog signal Vin is input to the non-inverted input terminals of the respective voltage comparison devices D1 to Dn. In addition, the potentials VR(1) to VR(n) of the nodes N41 to N4n are supplied to the inverted input terminals of the voltage comparison devices D1 to Dn, respectively.

Consequently, the output signals VD1 to VDn of the voltage comparison devices D1 to Dn show a high level when the analog signal Vin is higher than the potentials VR(1) to VR(n), respectively. The output signals VD1 to VDn show a low level when the analog signal Vin is lower than the potentials VR(1) to VR(n), respectively. The encoder 1121 encodes the output signals VD1 to VDn of the voltage comparison devices D1 to Dn to output an n-bit digital signal Dout.

In the example shown in FIG. 14, the reference voltage control circuit 1017 controls the variable resistor R5 so that the resistance ratios among the variable resistor R5:the resistor R4:the resister R3:the resistor R2:the resistor R1 are set to 4:1:1:1:1 at the first cycle. Then, the ratios are set to 8:1:1:1:1 at the second cycle, 16:1:1:1:1 at the third cycle, and 32:1:1:1:1 at the fourth cycle. Here, the second and subsequent cycles use three resistors R2 to R4 for 3-bit conversion. Now, if the gain of the second amplifier circuit 1015 is to be doubled, the reference voltage control circuit 1017 controls the variable resistor R5 so that the ratios are set to 4:1:1:1:1 at the first cycle, 16:1:1:1:1 at the second cycle, 64:1:1:1:1 at the third cycle, and 256:1:1:1:1 at the fourth cycle.

In this way, the reference voltage range created by the top-potential reference voltage VRT and the bottom-potential reference voltage VRB can be reduced at each succeeding cycle, thereby making the reference voltages smaller.

Figure 17:
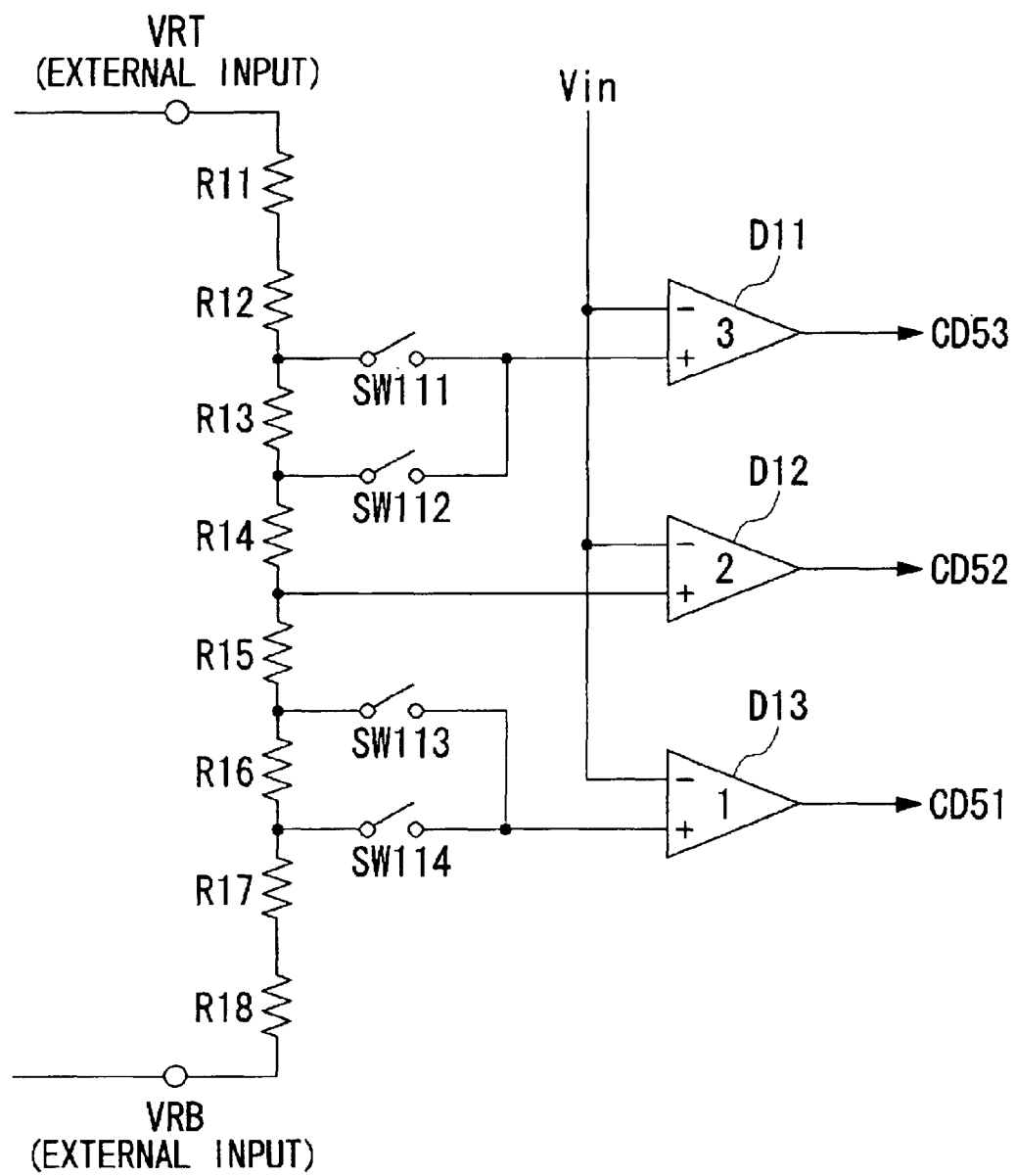
FIG. 17 is a diagram showing another configuration of the AD conversion circuit according to the first embodiment of the second group.

FIG. 17 is a diagram showing another configuration of the AD conversion circuit which changes the reference voltages. This AD conversion circuit deals with an example of 2-bit conversion without any redundancy bit. Eight resistors R11 to R18 having the same resistance are connected in series between the top-potential reference voltage VRT and the bottom-potential reference voltage VRB. The node between the second resistor R12 and the third resistor R13, in descending order, is connected to a voltage comparison device D11 through a switch SW111. The node between the third resistor R13 and the fourth resistor R14 is connected to the voltage comparison device D11 through a switch SW112. The node at the center of the resistor row is connected to a voltage comparison device D12. The node between the fifth resistor R15 and the sixth resistor R16 is connected to a voltage comparison device D13 through a switch SW113. The node between the sixth resistor R16 and the seventh resistor R17 is connected to the voltage comparison device D13 through a switch SW114. Besides, the input analog signal Vin is input to each of the voltage comparison devices D11 to D13.

In this circuit, when the switch SW111 and the switch SW114 are turned on, reference voltages each equivalent to a quarter of the reference voltage range between the top-potential reference voltage VRT and the bottom-potential reference voltage VRB can be supplied to the three voltage comparison devices D11 to D13. When the switches SW111 and SW114 are turned off and the switches SW112 and SW113 are turned on, reference voltages each equivalent to a quarter of a reference voltage range that is one half the foregoing reference voltage range can be supplied to the three voltage comparison devices D11 to D13.

The voltage comparison devices D11 to D13 compare the input analog signal Vin with the respective input analog signals Vin input thereto. As a result, a Gray code is output in such a parallel form that certain voltage comparison devices Dn and higher output low and the lower voltage comparison device(s) Dn−1 output(s) high. This Gray code is then converted into a binary code.

While FIG. 17 shows the case where the voltage comparison devices D11 to D13 are of single input, the reference voltages can be changed similarly even with differential input. Moreover, the AD conversion circuit is not limited to two-bit conversion, but may of course be applied to multi-bit conversion for a greater number of bits.

Next, description will be given of an example where the reference voltages supplied to the voltage comparison devices in the AD conversion circuit are changed by using a technique other than the utilization of resistance division. The reference voltages are supplied to the foregoing voltage comparison devices while the input mode is changed like from differential input to single input, or from single input to differential input. Providing the same number of voltage comparison devices, single-input comparisons can be made at half intervals as compared to differential-input.

Figure 18A:
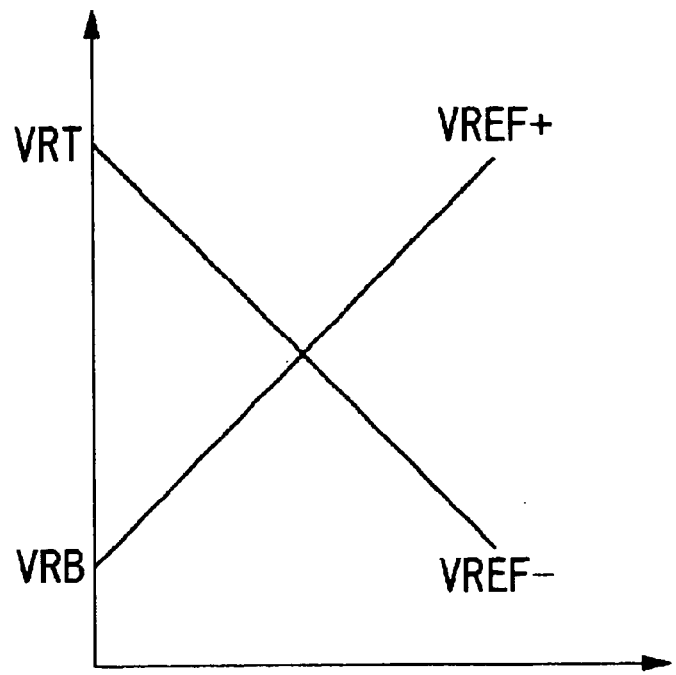
FIG. 18a is a diagram schematically showing the range of reference voltages for the case of single input according to the first embodiment of the second group.
Figure 18B:
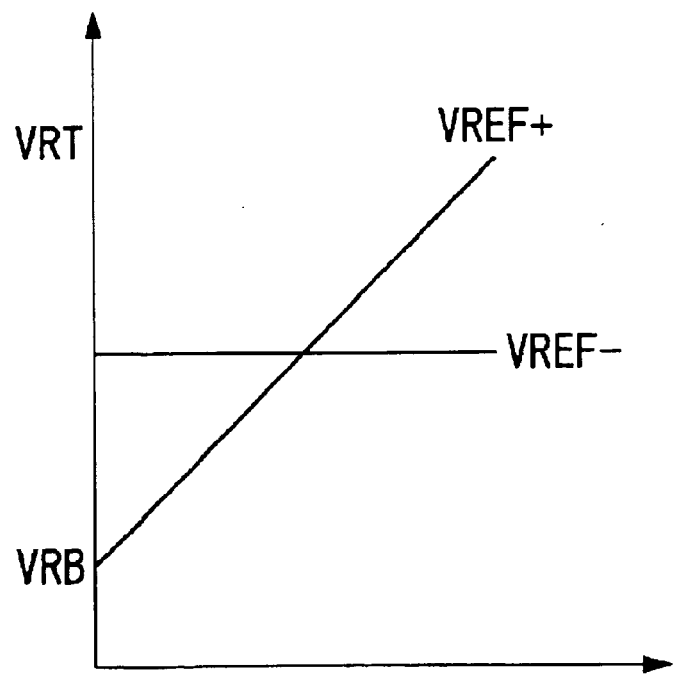
FIG. 18b is a diagram schematically showing the range of reference voltages for the case of differential input according to the first embodiment of the second group.

FIGS. 18a and 18b are charts schematically showing the range of reference voltages for the cases of single input and differential input. FIG. 18a is for the case of single input. FIG. 18b is for differential input. In the case of single input, the range of reference voltages available is (the bottom-potential reference voltage VRB–the top-potential reference voltage VRT) to (the top-potential reference voltage VRT–the bottom-potential reference voltage VRB). In the case of differential input, the range of referential voltages available is ½ (the bottom-potential reference voltage VRB–the top-potential reference voltage VRT) to ½ (the top-potential reference voltage VRT–the bottom-potential reference voltage VRB). The range of reference voltages for the case of differential input is narrower than with single input since what are input are the differences between voltages of higher and lower potentials. In FIG. 18b, the reference voltage VREF(−) is fixed so that the range of reference voltages is one half that for single input.

Figure 19:
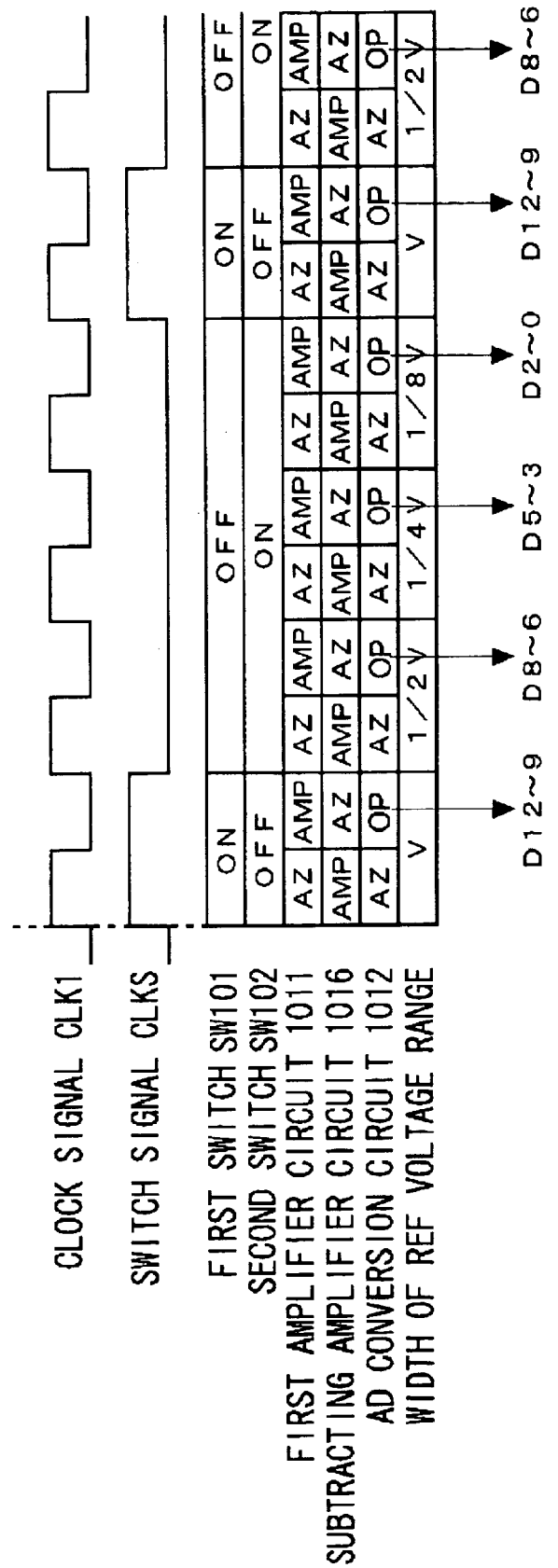
FIG. 19 is a timing chart showing the process of operation of the AD converter according to the first embodiment of the second group.

Next, description will be given of the operation of the entire AD converter according to the first embodiment of the second group. FIG. 19 is a timing chart showing the process of operation of the AD converter according to the first embodiment of the second group. The two signal waveforms show a clock signal CLK1 and a switch signal CLKS. The switch signal CLKS controls on/off status of the first switch SW101 and the second switch SW102 which make synchronous operations. The first switch SW101 is turned on when the switch signal CLKS is high, and turned off when the switch signal CLKS is low. The second switch SW102 is turned on when the switch signal CLKS is low, and turned off when the switch signal CLKS is high.

The first amplifier circuit 1011 amplifies the input analog signal and outputs the resultant to the subtractor circuit 1014 when the clock signal CLK1 is low, and makes an auto-zero operation when the clock signal CLK1 is high. The subtracting amplifier circuit 1016 amplifies the input analog signal and outputs the resultant to the first amplifier circuit 1011 and the AD conversion circuit 1012 when the clock signal CLK1 is high, and makes an auto-zero operation when the clock signal CLK1 is low. The AD conversion circuit 1012 makes a converting operation to output a digital value when the clock signal CLK1 is low, and makes an auto-zero operation when the clock signal CLK1 is high. The reference voltage range for generating the reference voltages for the plurality of voltage comparison devices constituting the AD conversion circuit 1012 decreases to a half in width when the clock signal CLK1 rises from low to high. The reference voltage range decreases to one eighth in four periods, and then returns to the initial value after the AD conversion circuit 1012 completes the 13-bit conversion.

According to the present embodiment, even in such cases that the product of the gains of the first amplifier circuit 1011 and the subtracting amplifier circuit 1016 is adjusted to vary the range of the analog signal cycle by cycle for the sake of speedup, the reference voltage control circuit 1017 can control the reference voltage range of the AD conversion circuit 1012 to achieve AD conversion with ensured conversion accuracies.

(Second Embodiment)

In the present embodiment, the first amplifier circuit is given a gain of 2 and the second amplifier circuit a gain of 2 while the amplifier circuit 1011 according to the first embodiment of the second group has a gain of 1 and the second amplifier circuit 1015 a gain of 4. This allows speedup further than in the first embodiment of the second group.

Figure 20:
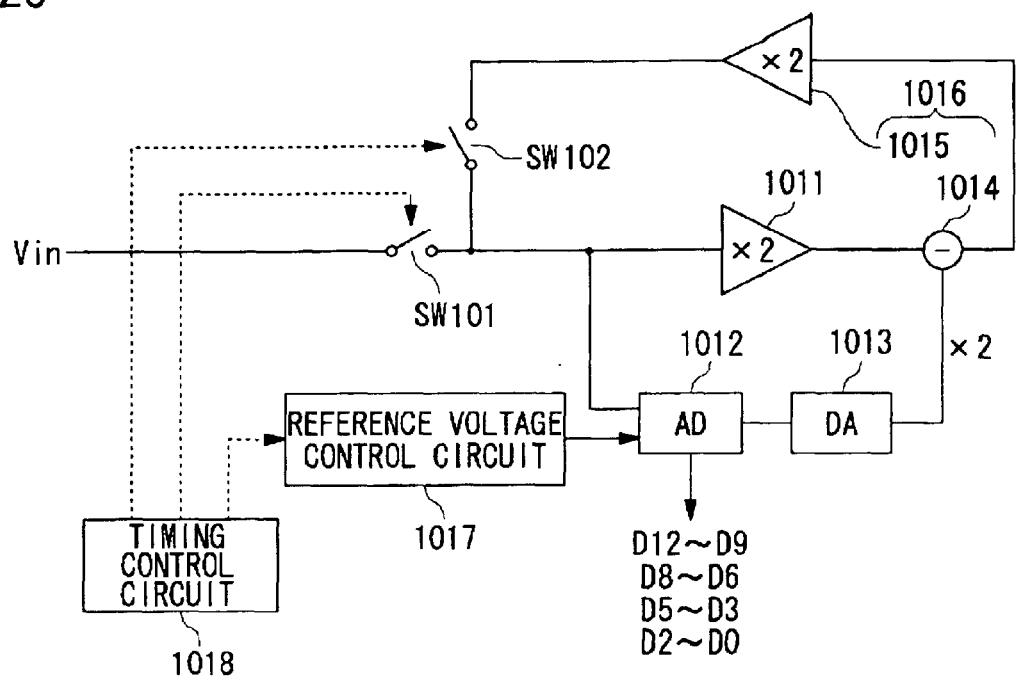
FIG. 20 is a diagram showing the configuration of the AD converter according to a second embodiment of the second group.

FIG. 20 shows the configuration of the AD converter according to the second embodiment of the second group. In the AD converter, an input analog signal Vin is input to a first amplifier circuit 1011 and an AD conversion circuit 1012 through a first switch SW101. The AD conversion circuit 1012 converts the input analog signal into a maximum of four bits of digital value, and outputs the same to a not-shown encoder and a DA conversion circuit 1013. The DA conversion circuit 1013 converts the 4-bit maximum digital value output from the AD conversion circuit 1012 into an analog signal.

The first amplifier circuit 1011 samples and holds the input analog signal, which is amplified by two and output to a subtractor circuit 1014. The subtractor circuit 1014 subtracts the analog value output from the DA conversion circuit 1013 from the analog value output from the first amplifier circuit 1011. Here, the analog value output from the DA conversion circuit 1013 is amplified by two, which corresponds to the gain of the first amplifier circuit 1011. A second amplifier circuit 1015 is a circuit which amplifies the output of the subtractor circuit 1014 and feeds back the resultant to the first amplifier circuit 1011 and the AD conversion circuit 1012, with a gain of 2. Incidentally, the subtractor circuit 1014 and the second amplifier circuit 1015 may be replaced with a subtracting amplifier circuit 1016, an amplifier circuit having a subtracting function. A reference voltage control circuit 1017 exercises control so that the reference voltage range of the AD conversion circuit 1012 decreases by half at each cycle. A timing control circuit 1018 controls on/off status of the first switch SW101 and a second switch SW102. It also supplies the reference voltage control circuit 1017 with the timing of each unit cycle.

The output of the second amplifier circuit 1015 is fed back through the second switch SW102. The AD conversion circuit 1012 converts the fed-back analog signal into a 3-bit digital value, and outputs the same to the not-shown encoder and the DA conversion circuit 1013.

The number of times of the cyclic processing through the feedback of the second amplifier circuit 1015 is four. At the first cycle, or an initial stage, the first switch SW101 is turned on and the second switch SW102 off. The AD conversion circuit 1012 generates the values of, in descending order, the first to fourth bits (D12–D9) of a 13-bit digital value for the AD converter to output eventually.

At the second to fourth cycles, the first switch SW101 is turned off and the second switch SW102 on. The AD conversion circuit 1012 generates the values of, in descending order, the fifth to seventh bits (D8–D6), the values of the eighth to tenth bits (D5–D3), and the values of the eleventh to thirteenth bits (D2–D0) of the final 13-bit digital value. The transition of the reference voltage range for generating reference voltages is the same as shown in FIG. 15.

In this way, the reference voltage range for generating the reference voltages of the AD conversion circuit 1012 is reduced by half at each cycle. Since the first amplifier circuit 1011 has a gain of 2, the gain of the second amplifier circuit 1015 can be set at 2, not to 4 which has been required in the first embodiment of the second group. This can improve the speed of the second amplifier circuit 1015, with an improvement in the speed of the entire AD converter. Since the accuracy required of the AD conversion circuit 1012 decreases at each succeeding cycle, it is possible to reduce the reference voltages at each cycle.

Figure 21:
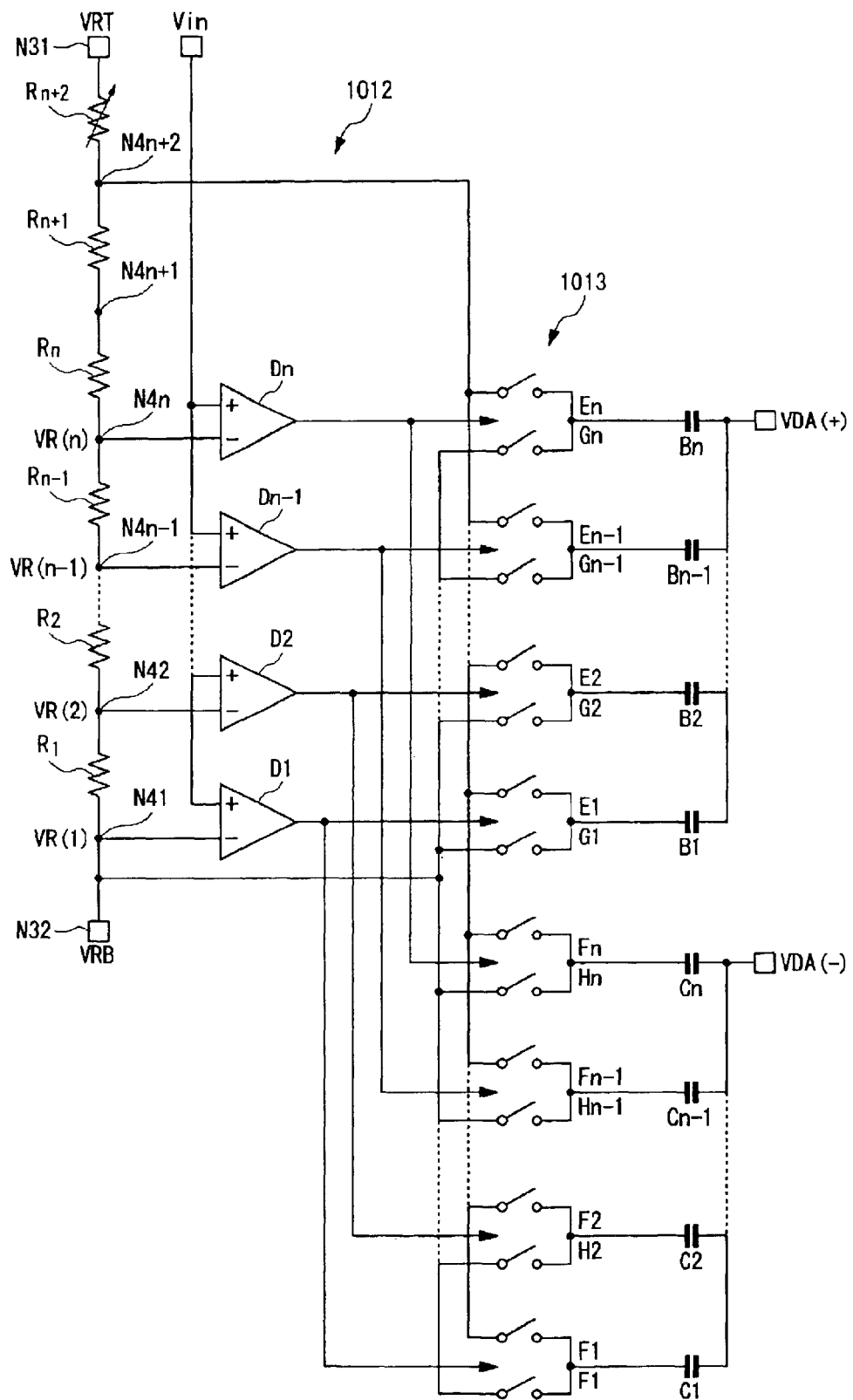
FIG. 21 is a diagram showing the configuration of an AD conversion circuit and a DA conversion circuit according to the second embodiment of the second group.

Next, description will be given of the method for amplifying the output of the DA conversion circuit by two, corresponding to the gain of the first amplifier circuit 1011. FIG. 21 is a circuit diagram showing the AD conversion circuit and the DA conversion circuit. The AD conversion circuit 1012 is of full-parallel comparison, i.e., flash system.

The AD conversion circuit 1012 consists of n resistors R1 to Rn, a magnification setting resistor Rn+1, a range controlling resistor Rn+2, and n voltage comparison devices D1 to Dn. The outputs of the voltage comparison devices D1 to Dn are input to the DA conversion circuit 1013 and the not-shown encoder.

The resistors R1 to Rn, the magnification setting resistor Rn+1, and the range controlling resistor Rn+2 are connected in series between a top-potential node N31 which receives a top-potential reference voltage VRT and a bottom-potential node N32 which receives a bottom-potential reference voltage VRB. Here, the nodes N41 to N4n lying between the n resistors R1 to Rn across the bottom-potential node N32 and the top-potential node N31, excluding the magnification setting resistor Rn+1 and the range controlling resistor Rn+2, or between the bottom resistor R1 and the bottom-potential node N32 shall have potentials of VR(1) to VR(n), respectively. These resistors R1 to Rn have the same resistance, so that the reference voltages VR(1) to VR(n) are generated at regular intervals.

The AD conversion circuit 1012 is of single input, and the reference voltage range thereof is thus given simply by (the top-potential reference voltage VRT–the bottom-potential reference voltage VRB). The DA conversion circuit 1013 is of differential output, and thus the reference voltage range thereof is given by the sum of |the top-potential reference voltage VRT–the bottom-potential reference voltage VRB| and |the bottom-potential reference voltage VRB–the top-potential reference voltage VRT|. Consequently, in situations where the magnification setting resistor Rn+1 is not connected or is shorted, the reference voltage range of the DA conversion circuit 1013 is twice that of the AD conversion circuit 1012. Incidentally, the reference voltage ranges of the AD conversion circuit 1012 and the DA conversion circuit 1013 have a ratio of 1:1 if the AD conversion circuit 1012 is also configured as a differential-input type.

The insertion of the magnification setting resistor Rn+1 allows gain settings other than 2. For example, a gain of 4 can be achieved by setting the resistor Rn+1 at the same value as the combined resistance of the subsequent resistors Rn to R1. Moreover, if the magnification setting resistor Rn+1 is a variable resistor, the gain can be set arbitrarily.

The range controlling resistor Rn+2 is a variable resistor which steps down the top-potential reference voltage VRT. Suppose that the potential of the node N4n+2 is given by $1/(X+1)$VRT. Initially, in order to set the potential of the node N4n+2 to the top-potential reference voltage VRT, the resistance of the range controlling resistor Rn+2 is greatly reduced to zero, or the source of the top-potential reference voltage and the node N4n+2 are shorted. Then, to reduce the reference voltages by half, the resistance of the range controlling resistor Rn+2 is set so that X=1. To reduce the reference voltages to ¼, the resistance of the range controlling resistor Rn+2 is set so that X=3.

The analog signal Vin is input to the non-inverted input terminals of the respective voltage comparison devices D1 to Dn. Besides, the reference voltages VR(1) to VR(n) of the nodes N41 to N4n are supplied to the inverted input terminals of the voltage comparison devices D1 to Dn, respectively.

As a result, the voltage comparison devices D1 to Dn output the output signals VD1 to VDn of high level when the analog signal Vin is higher than the reference voltages VR(1) to VR(n), respectively. The output signals VD1 to VDn fall to a low level when the analog signal Vin is lower than the reference voltages VR(1) to VR(n), respectively.

The not-shown encoder encodes the output signals VD1 to VDn of the respective voltage comparison devices D1 to Dn to output a digital signal Dout which has the number of bits corresponding to the number of the voltage comparison devices D1 to Dn.

The DA conversion circuit 1013 is a DA conversion circuit of capacitor array type. The DA conversion circuit 1013 comprises n positive VRT switches E1 to En, n negative VRT switches F1 to Fn, n positive VRB switches G1 to Gn, n negative VRB switches H1 to Hn, n positive capacitors B1 to Bn, and n negative capacitors C1 to Cn. The switches E1 to En, F1 to Fn, G1 to Gn, and H1 to Hn are connected in an array form.

The positive capacitors B1 to Bn and the negative capacitors C1 to Cn all have the same capacitance c. Either ones of the terminals of the positive capacitors B1 to Bn (hereinafter, referred to as output terminals) generate a differential positive output voltage VDA(+). Either ones of the terminals of the negative capacitors C1 to Cn (hereinafter, referred to as output terminals) generate a differential negative output voltage VDA(−). Incidentally, the other terminals of the positive capacitors B1 to Bn and the negative capacitors C1 to Cn will be referred to as input terminals.

Either ones of the terminals of the positive VRT switches E1 to En are connected to the top-potential node N4n+2. The other terminals are connected to the input terminals of the positive capacitors B1 to Bn. Either ones of the terminals of the negative VRT switches F1 to Fn are connected to the top-potential node N4n+2. The other terminals are connected to the input terminals of the negative capacitors C1 to Cn. Either ones of the terminals of the positive VRB switches G1 to Gn are connected to the bottom-potential node N32. The other terminals are connected to the input terminals of the positive capacitors B1 to Bn. Either ones of the terminals of the negative VRB switches H1 to Hn are connected to the bottom-potential node N32. The other terminals are connected to the input terminals of the negative capacitors C1 to Cn.

The positive VRT switches E1 to En, the negative VRT switches F1 to Fn, the positive VRB switches G1 to Gn, and the negative VRB switches H1 to Hn having the same numbers constitute respective series of four switches. For example, the positive VRT switch E1, the negative VRT switch F1, the positive VRB switch G1, and the negative VRB switch H1 constitute a series. The positive VRT switch En, the negative VRT switch Fn, the positive VRB switch Gn, and the negative VRB switch Hn also constitute a series. Then, the positive VRT switches E1 to En, the negative VRT switches F1 to Fn, the positive VRB switches G1 to Gn, and the negative VRB switches H1 to Hn make on/off operations according to the output levels of the voltage comparison devices D1 to Dn, respectively. For example, when the output of the voltage comparison device Dn is at a high level, the positive VRT switch En and the negative VRB switch Hn are turned on, and the positive VRB switch Gn and the negative VRT switch Fn are turned off. In contrast, when the output of the voltage comparison device Dn is at a low level, the positive VRT switch En and the negative VRB switch Hn are turned off, and the positive VRB switch Gn and the negative VRT switch Fn are turned on.

Next, description will be given of the operation of the DA conversion circuit 1013. Under an initial condition, both the input terminals and the output terminals of the positive capacitors B1 to Bn have a potential of 0 V. All the positive VRT switches E1 to En, the negative VRT switches F1 to Fn, the positive VRB switches G1 to Gn, and the negative VRB switches H1 to Hn are off. Consequently, under the initial condition, the total charge Q1 stored in the positive capacitors B1 to Bn and the negative capacitors C1 to Cn is 0.

Here, when m devices out of the n voltage comparison devices D1 to Dn output a high level, m switches out of the positive VRT switches E1 to En are turned on and (n−m) switches are turned off. Among the positive VRB switches G1 to Gn, (n−m) switches are turned on and m switches are turned off. According to these on/off operations of the positive VRT switches E1 to En and the positive VRB switches G1 to Gn, the total charge Q2 stored in the positive capacitors B1 to Bn is given by the following equation (A1):

$$Q2 = m\{VRT-(\text{voltage drop of } Rn+2)-VDA(+)\}c+(n-m)\{VRB-VDA(+)\}c. \quad (A1)$$

From the law of conservation of charge, Q1=Q2. Thus, the analog VDA(+) is given by the following equation (A2):

$$VDA(+) = VRB + m\{VRT-(\text{voltage drop of } Rn+2)-VRB\}/n. \quad (A2)$$

Meanwhile, when m devices out of the n voltage comparison devices D1 to Dn output a high level, m switches out of the negative VRB switches H1 to Hn are turned on and (n−m) switches are turned off. Among the negative VRT switches F1 to Fn, (n−m) switches are turned on and m switches are turned off. According to these on/off operations of the negative VRB switches H1 to Hn and the negative VRT switches F1 to Fn, the total charge Q3 stored in the negative capacitors C1 to Cn is given by the following equation (A3):

$$Q3 = (n-m)\{VRT-(\text{voltage drop of } Rn+2)-VDA(-)\}c+m\{VRB-VDA(-)\}c. \quad (A3)$$

From the law of conservation of charge, Q1=Q3. Thus, the analog VDA(−) is given by the following equation (A4):

$$VDA(-) = VRT - (\text{voltage drop of } Rn+2) - m\{VRT - (\text{voltage drop of } Rn+2) - VRB\}/n. \quad (A4)$$

Thus, from the foregoing equations (A2) and (A4), the analog signal VDA is given by the following equation (A5):

$$\begin{aligned} VDA &= VDA(+) - VDA(-) \quad (A5) \\ &= VRB - VRT - (\text{voltage drop of } Rn+2) + 2m\{VRT - \\ & \quad (\text{voltage drop of } Rn+2) - VRB\}/n. \end{aligned}$$

Since the reference range to be supplied to the AD conversion circuit 1012, or {VRT−(voltage drop of Rn+2)−(voltage drop of Rn+1)−VRB}, and the reference range to be supplied to the DA conversion circuit 1013, or {VRT−(voltage drop of the resistor Rn+2)−VRB}, are thus set to a predetermined ratio, it is possible to amplify the output of the DA conversion circuit 1013 by a predetermined magnification. Consequently, the output of the DA conversion circuit 1013 can be amplified in accordance with the gain of the first amplifier circuit 1011.

In the present embodiment, the reference voltage control circuit 1017 can also control the reference voltage range of the AD conversion circuit 1012 to achieve AD conversion with ensured conversion accuracies even when the range of the analog signal varies cycle by cycle, as in the first embodiment of the second group.

(Third Embodiment)

A third embodiment of the second group provides a cyclic AD converter having the configuration of changing the reference voltages of the AD conversion circuit 1012 and the gain of the first amplifier circuit 1011 as well.

Figure 22A:
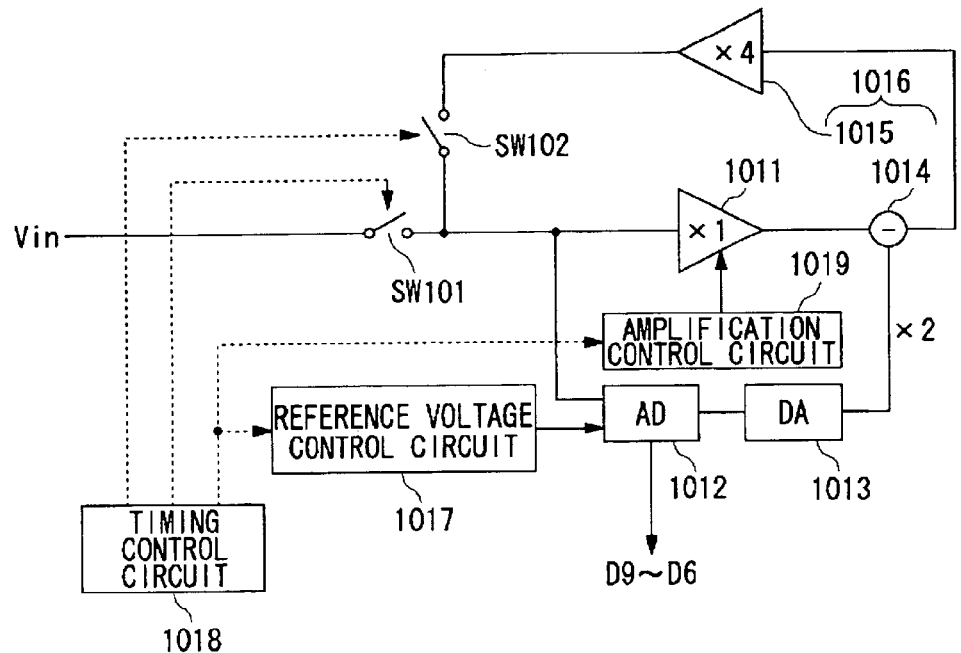
FIG. 22a is a diagram showing the configuration of the AD converter at its first cycle according to a third embodiment of the second group.
Figure 22B:
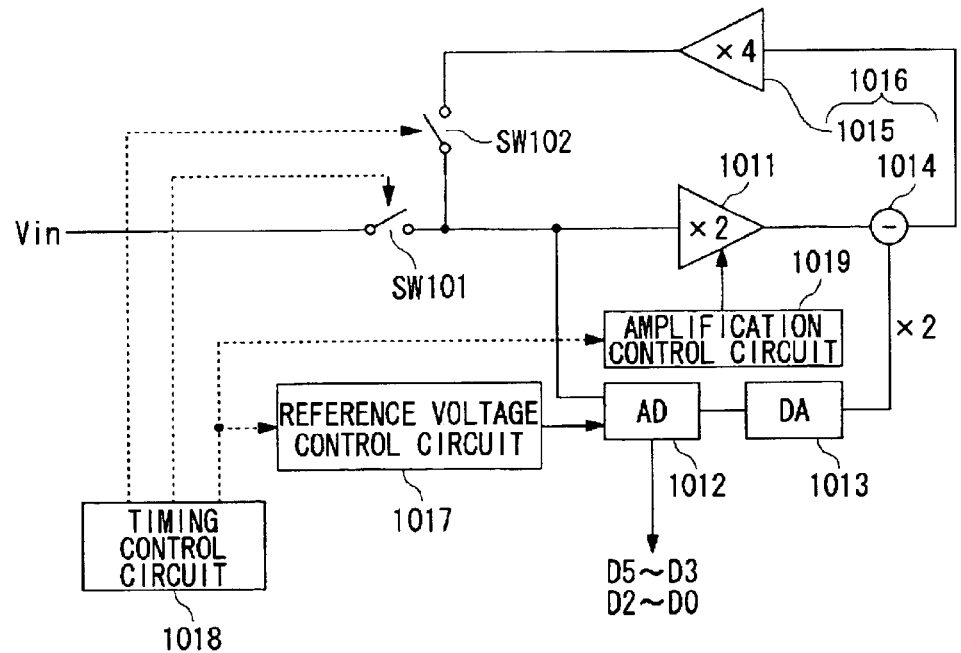
FIG. 22b is a diagram showing the configuration of the AD converter at the second and subsequent cycles according to the third embodiment of the second group.

FIG. 22*a* shows the configuration of the AD converter at its first cycle according to the third embodiment of the second group. FIG. 22*b* shows the configuration of the AD converter at the second and subsequent cycles according to the second embodiment of the second group. In the AD converter, an input analog signal Vin is input to a first amplifier circuit 1011 and an AD conversion circuit 1012 through a first switch SW101. The AD conversion circuit 1012 converts the input analog signal into a maximum of four bits of digital value, and outputs the same to a not-shown encoder and a DA conversion circuit 1013. The DA conversion circuit 1013 converts the 4-bit maximum digital value output from the AD conversion circuit 1012 into an analog signal.

The first amplifier circuit 1011 is a circuit which samples and holds the input analog signal. In the present embodiment, the input analog signal is not amplified at the first cycle. An amplification control circuit 1019 controls the gain of the amplifier circuit 1011. A subtractor circuit 1014 subtracts the analog value output from the DA conversion circuit 1013 from the analog value held in the first amplifier circuit 1011. A second amplifier circuit 1015 is a circuit which amplifies the output of the subtractor circuit 1014 and feeds back the resultant to the first amplifier circuit 1011 and the AD conversion circuit 1012, with a gain of 4. A reference voltage control circuit 1017 exercises control so that the reference voltage range of the AD conversion circuit 1012 decreases by half at the second and subsequent cycles. A timing control circuit 1018 controls on/off status of the first switch SW101 and a second switch SW102. It also supplies the reference voltage control circuit 1017 and the amplification control circuit 1019 with the timing of each unit cycle.

The output of the second amplifier circuit 1015 is fed back through the second switch SW102. The AD conversion circuit 1012 converts the fed-back analog value into a 3-bit digital value, and outputs the same to the not-shown encoder and the DA conversion circuit 1013.

The number of times of the cyclic processing through the feedback of the second amplifier circuit 1015 is three. At the first cycle, or an initial stage, the first switch SW101 is turned on and the second switch SW102 off. The AD conversion circuit 1012 generates the values of, in descending order, the first to fourth bits (D9–D6) of a 10-bit digital value for the AD converter to output eventually.

For the sake of 4-bit conversion, the AD conversion circuit 1012 requires 16 ($2^4$) voltage comparison devices which are not shown. Assuming that the input analog signal is 1 Vpp, the sixteen voltage comparison devices provided in the AD conversion circuit 1012 have reference voltages in steps of $\frac{1}{16}$ V.

At the second and third cycles, the first switch SW101 is turned off and the second switch SW102 on. The AD conversion circuit 1012 generates the values of, in descending order, the fifth to seventh bits (D5–D3) and the values of the eighth to tenth bits (D2–D0) of the final 10-bit digital value.

According to the example described above, the outputs of the voltage comparison devices having reference voltages in steps of $\frac{1}{16}$ V are converted into an analog value by the DA conversion circuit 1013, and subtracted from the output signal of the first amplifier circuit 1011 by the subtractor circuit 1014. The output signal of the subtractor circuit 1014 is amplified fourfold by the second amplifier circuit 1015. The output signal of the second amplifier circuit 1015 returns to the first amplifier circuit 1011 and the AD conversion circuit 1012 again. This signal has a maximum amplitude of $\frac{1}{16} \times 4 = \frac{1}{4}$ Vpp. For 3-bit conversion of this signal, voltage comparison devices having reference voltages in steps of $1/4 \div 8(2^3)=1/32$ V are required. Thus, the reference voltage control circuit 1017 changes the reference voltages by reducing the reference voltage range for the second and subsequent cycles to half the reference voltage range for the first cycle.

At the second and subsequent cycles, the input voltage to the first amplifier circuit 1011 is not so high. This precludes the problem of an insufficient output voltage. Then, the amplification control circuit 1019 doubles the gain of the amplifier circuit 1011. The signal of the second cycle returns to the first amplifier circuit 1011 and the AD conversion circuit 1012 with $1/32 \times 2$ (the gain of the first amplifier circuit 1011)×4 (the gain of the second amplifier circuit 1015)=$1/4$ Vpp.

Figure 23:
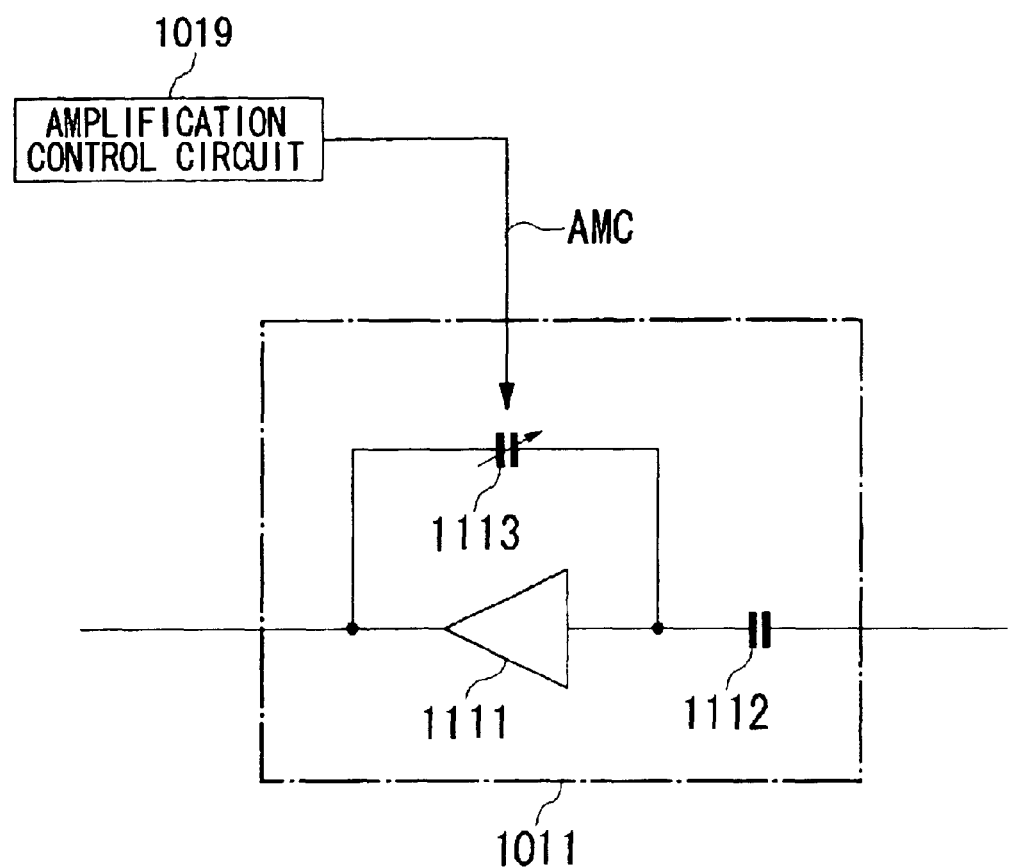
FIG. 23 is a diagram showing the configuration of a first amplifier circuit according to the third embodiment of the second group.

FIG. 23 shows the amplification control circuit 1019 and the detailed configuration of the first amplifier circuit 1011. The first amplifier circuit 1011 chiefly includes an operational amplifier 1111, a first capacitor 1112, and a second capacitor 1113. The first capacitor 1112 is situated on the input side of the operational amplifier 1111, and has a fixed capacitance. The second capacitor 1113 is situated across the input and output of the operational amplifier 1111, and has a variable capacitance. The capacitance of the second capacitor 1113 is switched by an amplification switch signal AMC output from the amplification control circuit 1019. The gain of the first amplifier circuit 1011 is given by C1/C2, where C1 is the capacitance of the first capacitor 1112 and C2 is the capacitance of the second capacitor 1113. In the present embodiment, the gain of the first amplifier circuit 1011 is switched between 1 and 2. The second capacitor 1113 is thus configured to provide two possible capacitance settings. For example, the second capacitor 1113 may be composed of two capacitors which have the same capacitance and are connected in parallel via a switch. In that case, the number of capacitors in connection is changed by the switch, which is controlled on/off by the amplification switch signal AMC.

Figure 24:
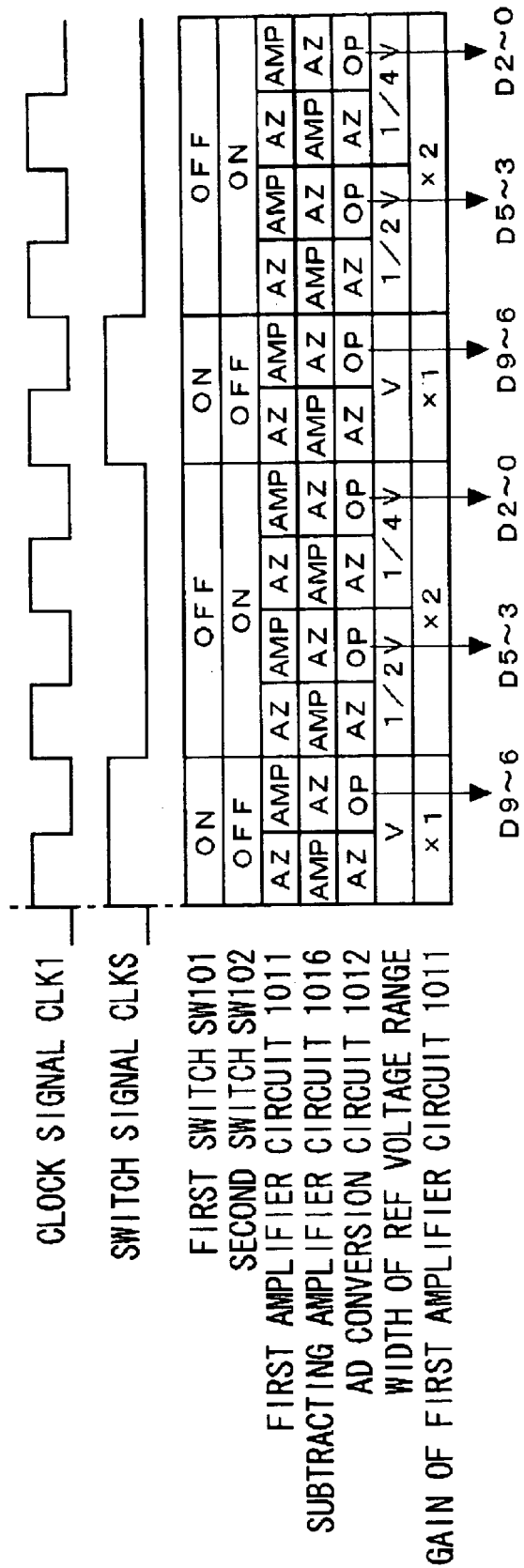
FIG. 24 is a timing chart showing the process of operation of the AD converter according to the third embodiment of the second group.

Next, description will be given of the operation of the entire AD converter according to the third embodiment of the second group. FIG. 24 is a timing chart showing the process of operation of the AD converter according to the third embodiment of the second group. The two signal waveforms show a clock signal CLK1 and a switch signal CLKS. The switch signal CLKS controls on/off status of the first switch SW101 and the second switch SW102 which make synchronous operations. The first switch SW101 is turned on when the switch signal CLKS is high, and turned off when the switch signal CLKS is low. The second switch SW102 is turned on when the switch signal CLKS is low, and turned off when the switch signal CLKS is high.

The first amplifier circuit 1011 amplifies the input analog signal and outputs the resultant to the subtractor circuit 1014 when the clock signal CLK1 is low, and makes an auto-zero operation when the clock signal CLK1 is high. The subtracting amplifier circuit 1016 amplifies the input analog signal and outputs the resultant to the first amplifier circuit 1011 and the AD conversion circuit 1012 when the clock signal CLK1 is high, and makes an auto-zero operation when the clock signal CLK1 is low. The AD conversion circuit 1012 makes a converting operation to output a digital value when the clock signal CLK1 is low, and makes an auto-zero operation when the clock signal CLK1 is high. The reference voltage range for generating the reference voltages of the plurality of voltage comparison devices constituting the AD conversion circuit 1012 decreases by half in width when the clock signal CLK1 rises from low to high. The reference voltage range decreases to one fourth in three periods, and then returns to the initial value after the AD conversion circuit 1012 completes the 10-bit conversion. The amplification control circuit 1019 sets the gain of the amplifier circuit 1011 to 1 when the switch signal CLKS is high, and sets the gain of the amplifier circuit 1011 to 2 when the switch signal CLKS is low.

Figure 26:
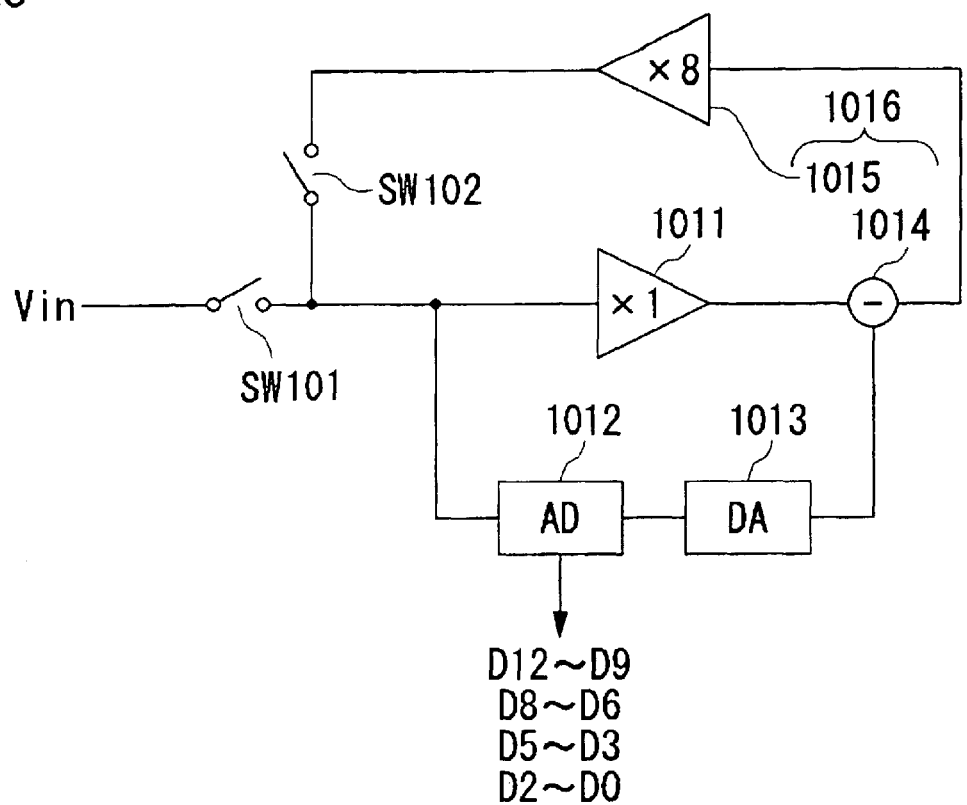
FIG. 26 is a diagram showing the configuration of a conventional cyclic AD converter of the second group.

According to the present embodiment, when the input analog signal Vin alone is to be input, the gain of the amplifier circuit 1011 can be reduced for lower voltages. The first amplifier circuit 1011 can start amplification at the point when the amplified output falls well within the range of output. This precludes the occurrence of signal errors. Then, at the second and subsequent cycles, the gain of the first amplifier circuit 1011 can be increased to secure a required gain while suppressing the gain of the subtracting amplifier circuit 1016. This allows speedup as compared to the conventional configuration shown in FIG. 26. According to the present embodiment, it is therefore possible to achieve both lower voltages and higher speed.

(Fourth Embodiment)

A fourth embodiment of the second group provides one in which a circuit which outputs the upper four bits (D9–D6) and the bottom two bits (D1–D0) is added to the prior stage of the cyclic AD converter according to the second embodiment of the second group. Consequently, the second AD conversion circuit 1020 can be shared for a smaller number of cycles and higher speed.

Figure 25:
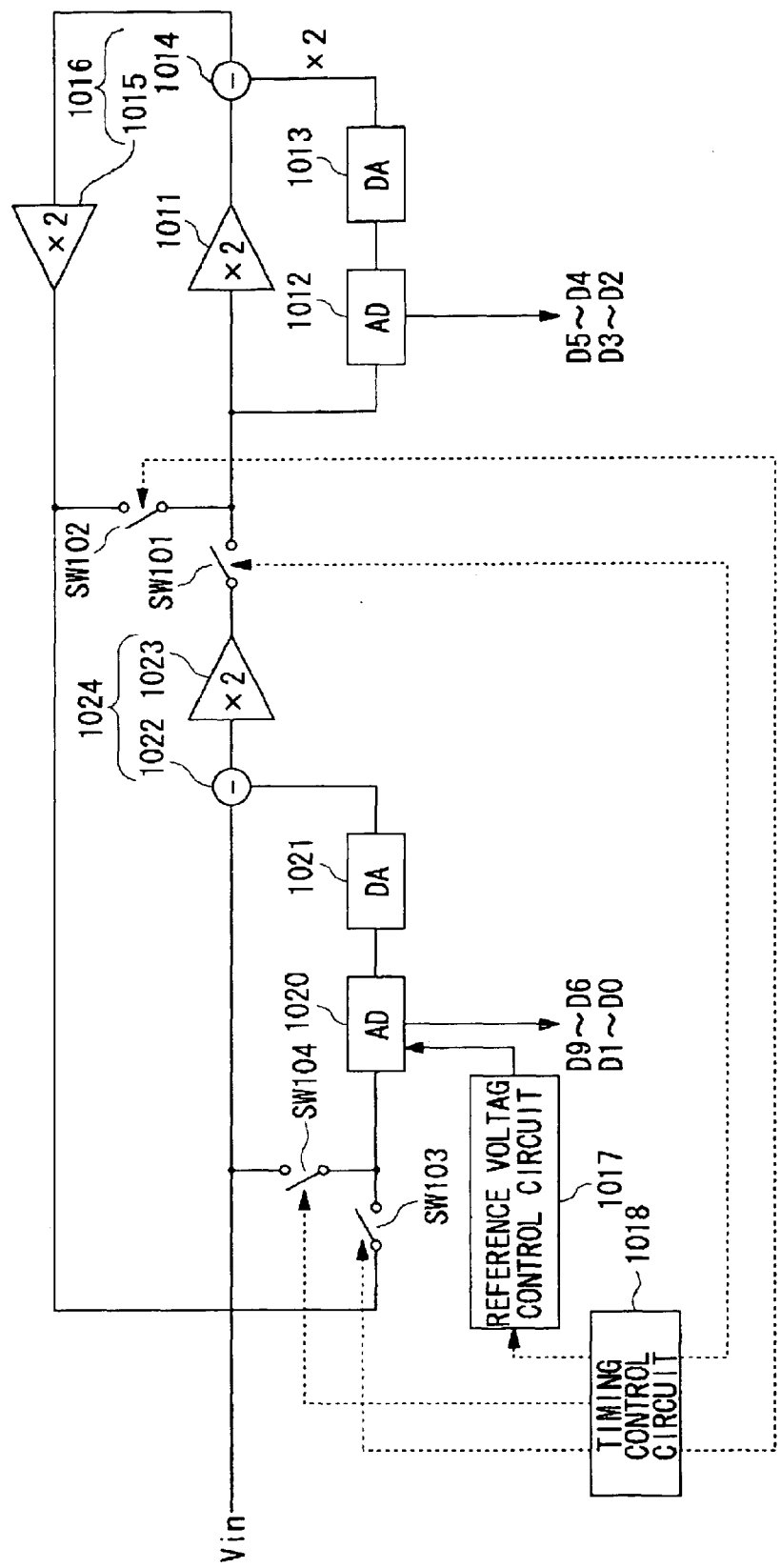
FIG. 25 is a diagram showing the configuration of the AD converter according to a fourth embodiment of the second group.

FIG. 25 shows the configuration of the AD converter according to the fourth embodiment of the second group. In the AD converter, an input analog signal Vin is input to a second AD conversion circuit 1020 through a fourth switch SW104. The second AD conversion circuit 1020 converts the input analog signal into a maximum of four bits of digital value, and outputs the same to a not-shown encoder and a second DA conversion circuit 1021. The second DA conversion circuit 1021 converts the 4-bit maximum digital value output from the second AD conversion circuit 1020 into an analog signal.

A second subtractor circuit 1022 subtracts the analog value output from the second DA conversion circuit 1021 from the input analog value. A third amplifier circuit 1023 amplifies the output of the second subtractor circuit 1022, and outputs the resultant to a first amplifier circuit 1011 and a first AD conversion circuit 1012 through a first switch SW101. The third amplifier circuit 1023 has a gain of 2. Incidentally, the second subtractor circuit 1022 and the third amplifier circuit 1023 may be replaced with a second subtracting amplifier circuit 1024, an amplifier circuit having a subtracting function. Besides, a sample-and-hold circuit may be inserted to the prior stage of the second subtractor circuit 1022. In the example of FIG. 25, subtraction is conducted with an adjustment to the timing of input to the second subtracting amplifier circuit 1024. A reference voltage control circuit 1017 exercises control so that the reference voltage range of the second AD conversion circuit 1020 decreases by half at the second cycle after the second AD conversion circuit 1020 outputs the upper four bits (D9–D6) to the not-shown encoder. A timing control circuit 1018 controls on/off status of the first switch SW101, a second switch SW102, a third switch SW103, and the fourth switch SW104. It also supplies the reference voltage control circuit 1017 with the timing of each unit cycle.

The first AD conversion circuit 1012 converts the input analog signal into a maximum of two bits of digital value, and outputs the same to a not-shown encoder and a first DA conversion circuit 1013. The first DA conversion circuit 1013 converts the 2-bit maximum digital value output from the first AD conversion circuit 1012 into an analog signal.

The first amplifier circuit 1011 samples and holds the input analog signal, which is amplified by two and output to a first subtractor circuit 1014. The first subtractor circuit 1014 subtracts the analog value output from the first DA conversion circuit 1013 from the analog value output from the first amplifier circuit 1011. Here, the analog value output from the first DA conversion circuit 1013 is amplified by two, corresponding to the gain of the first amplifier circuit 1011. This amplification can be effected by using the method shown in FIG. 21. The second amplifier circuit 1015 amplifies the output of the first subtractor circuit 1014, and feeds back the resultant to the first amplifier circuit 1011 and the first AD conversion circuit 1012 through the second switch SW102, or to the second AD conversion circuit 1020 through the third switch SW103. The second amplifier circuit 1015 has a gain of 2. Incidentally, the first subtractor circuit 1014 and the second amplifier circuit 1015 may be replaced with a first subtracting amplifier circuit 1016, an amplifier circuit having a subtracting function.

At the first cycle, or an initial stage, the fourth switch SW104 is turned on. The second AD conversion circuit 1020 generates the values of, in descending order, the first to fourth bits (D9–D6) of a 10-bit digital value for the AD converter to output eventually.

For the sake of 4-bit conversion, the second AD conversion circuit 1020 requires 16 ($2^4$) voltage comparison devices which are not shown. Assuming that the input analog signal is 1 Vpp, the sixteen voltage comparison devices provided in the second AD conversion circuit 1020 have reference voltages in steps of $1/16$ V.

The outputs of the foregoing voltage comparison devices are converted into an analog value by the second DA conversion circuit 1021, and subtracted from the input analog signal by the second subtractor circuit 1022. The output signal of the second subtractor circuit 1022 is amplified twofold by the third amplifier circuit 1023. The output signal of the third amplifier circuit 1023 is input to the first amplifier circuit 1011 and the first AD conversion circuit 1012. This signal has a maximum amplitude of $1/16 \times 2$ (the gain of the third amplifier circuit 1023)=$1/8$ Vpp. For 2-bit conversion of this signal, the first AD conversion circuit 1012 requires voltage comparison devices having reference voltages in steps of $1/8 \div 4$ ($2^2$)=$1/32$ V. The first AD conversion circuit 1012 outputs the fifth and sixth bits (D5–D4), in descending order, to the not-shown encoder.

The outputs of the foregoing voltage comparison devices are converted into an analog value by the first DA conversion circuit 1013, and subtracted from the input analog signal by the first subtractor circuit 1014. Here, the analog value output from the first DA conversion circuit 1013 is amplified by two, corresponding to the gain of the first amplifier circuit 1011. The output signal of the first subtractor circuit 1014 is amplified twofold by the second amplifier circuit 1015.

In this stage, the first switch SW101 is off, the second switch SW102 on, the third switch SW103 on, and the fourth switch SW104 off under the control of the timing control circuit 1018. The output signal of the second amplifier circuit 1015 returns to the first amplifier circuit 1011 and the first AD conversion circuit 1012. This signal has a maximum amplitude of $1/32 \times 2$ (the gain of the first amplifier circuit 1011)×2 (the gain of the second amplifier circuit 1015)=$1/8$ Vpp. The first AD conversion circuit 1012 outputs the seventh and eighth bits (D3–D2), in descending order, to the not-shown encoder.

At the same time, the $1/8$-Vpp output signal of the second amplifier circuit 1015 is input to the second AD conversion circuit 1020 through the third switch SW103. The second AD conversion circuit 1020 uses four out of the sixteen voltage comparison devices. For 2-bit conversion of this signal, the second AD conversion circuit 1020 requires voltage comparison devices having reference voltages in steps of $1/8 \times 4$ ($2^2$)=$1/32$ V. Then, the reference voltage control circuit 1017 changes the reference voltages by setting the reference voltage range for converting the ninth and tenth bits (D1–D0), in descending order, to one half the reference voltage range for converting the first to fourth top bits (D9–D6). The second AD conversion circuit 1020 outputs the ninth and tenth bits (D1–D0), in descending order, to the not-shown encoder.

According to the present embodiment, the reference voltages are changed so that the signal range coincides with the range of the reference voltages. For an alternative means, the signal range and the range of the reference voltages may be matched by changing the gain of the second amplifier circuit 1015 from 2 to 4 when passing the signal from the second amplifier circuit 1015 to the second AD conversion circuit 1020. In comparison with this case, the second amplifier circuit 1015 of the present embodiment has the fixed gain of 2, which achieves the speedup of the second amplifier circuit 1015.

According to the present embodiment, the reference voltage of the second AD conversion circuit can be changed to handle the cases where the two signals, or the input analog signal Vin and the output signal of the subtracting amplifier circuit 1016, have different ranges.

In all the embodiments of the second group described above, when the range of the analog signal Vin input from exterior is changed temporally, the reference voltage control circuit 1017 can control the reference voltage range of the AD conversion circuit 1012 in accordance with the range of the signal. This allows higher conversion accuracies.

In addition, it becomes easier to change the specifications of the AD converters. For example, when the AD converter shown in FIG. 23 is changed from the 10-bit specification of 4-3-3 bits to a 7-bit specification of 3-2-2 bits, the reference voltages of the AD conversion circuit 1012 can be changed to change the specification easily while maintaining the same configuration.

Up to this point, description has been given of the embodiments in the second group of the present invention. These embodiments are given solely by way of examples. Various modifications may be made of combinations of the components and processes. It would be understood by those skilled in the art that all such modifications are also intended to fall within the scope of the present invention.

In the embodiments of the second group, the parameters including the numbers of bits to be converted by the AD conversion circuit, the allocation thereof, the gains of the amplifier circuits, and the capacitances are shown solely by way of example. In a modification, other figures may be employed for these parameters.

As described in the fourth embodiment of the second group, the configuration for changing the reference voltages of the AD conversion circuit of the present invention is also applicable to an AD converter that has a plurality of stages, as long as the AD converter includes a cyclic configuration. Needless to say, it is also applicable to an AD converter including a plurality of cyclic configurations. Moreover, in such cases that the AD conversion circuit is to be shared, the reference voltages may be changed arbitrarily upon each use. This contributes to a reduction in circuit area.

What is claimed is:

1. An analog-to-digital converter comprising:
an AD coversion circuit which conerts an input analog signal into a predetermined number of bits of digital value;
a DA conversion circuit which converts the output of the Ad conversion circuit into an analog signal;
a subtractor circuit which subtracts of output of the DA conversion circuit from the input analog signal;
an amplifier circuit which amplifies the output of the subtractor circuit and feeds back the resultant to the AD conversion circuit for cyclic processing; and
an amplification control circuit which changes gain of the amplifier circuit according to the feedback-based cyclic processing, wherein
the amplification control circuit sets the gain lower in an initial stage of the cyclic processing, and changes the gain to increase according to the cyclic processing.

2. An analog-to-digital converter comprising:
an AD conversion circuit which converts an input analog signal into a predetermined number of bits of digital value;
a DA conversion circuit which converts the output of the AD conversion circuit into an analog signal;
a subtractor circuit which subtracts the output of the DA conversion circuit from the input analog signal;
an amplifier circuit which amplifies the output of the subtractor circuit and feeds back the resultant to the AD conversion circuit for cyclic processing; and
a clock control circuit which changes the pulse width of a control signal to be input at least to the AD conversion circuit according to the feedback-based cyclic processing, wherein
the clock control circuit sets the pluse width longer in an initial stage of the cyclic processing, and changes the pluse width to decrese according to the cyclic processing.

3. An analog-to-digital converter comprising:
a sample-and-hold circuit which holds an input analog signal;
an AD conversion circuit which converts the input analog signal into a predetermined number of bits of digital value;
a DA conversion circuit which converts the output of the AD conversion circuit into an analog signal;
a subtractor circuit which subtracts the output of the DA conversion circuit from the input analog signal;
an amplifier circuit which amplifies the output of the subtractor circuit and feeds back the resultant to the AD conversion circuit for cyclic processing; and
a capacitance control circuit which changes the capacitance of at least either one of the sample-and-hold circuit and the amplifier circuit according to the feedback-based cyclic processing, wherein
the capacitance control circuit sets the capacitance higher in an initial stage of the cyclic processing, and changes the capacitance to decrease according to the cyclic processing.

4. An analog-to-digital converter comprising:
an AD conversion circuit which converts an input analog signal into a predetermined number of bits of digital value;
a DA conversion circuit which converts the output of the AD conversion circuit into an analog signal;
a subtractor circuit which subtracts the output of the DA conversion circuit from the input analog signal;
an amplifier circuit which amplifies the output of the subtractor circuit with a predetermined gain, and feeds back the resultant to the AD conversion circuit; and
a reference voltage control circuit which changes reference voltages to be supplied to a plurality of voltage comparison devices arranged in the AD conversion circuit; and
a timing control circuit which generates and supplies timing to the reference voltage control circuit, whith the feedback to the AD conversion circuit as a single cycle of the timing,
wherein the reference voltage control circuit changes the reference voltages temporally in accordance with the timing supplied from the timing control circuit.

5. An analog-to-digital converter comprising:
an AD conversion circuit which converts an input analog signal into a predetermined number of bits of digital value at least in any one of the plurality of stages;
a DA conversion circuit which converts the output of the AD conversion circuit into an analog signal;
a first amplifier circuit which amplifies the input analog signal with a predetermined gain, being arranged in parallel with the AD conversion circuit;
a subtractor circuit which subtracts, from the output of the first ampplifier circuit, the output of the DA conversion circuit amplified with substantially the same gain as when amplified by the first amplifier circuit;
a second amplifier circuit which amplifies the output of the subtractor circuit with a predetermined gain, and feeds back the resultant to the AD conversion circuit and the first amplifier circuit;
a reference voltage control circuit which changes reference voltages to be supplied to a plurality of voltage comparison devices arranged in the AD conversion circuit; and
a timing control circuit which generates and supplies timing to the reference voltage control circuit, with the feedback to the AD conversion circuit as a single cycle of the timing,
wherein the reference voltage control circuit changes the reference voltages temporally in accordance with the timing supplied from the timing control circuit.

6. An analog-to-digital converter comprising:
an AD conversion circuit which converts an input analog signal into a predetermined number of bits of digital value;
a DA conversion circuit which converts the output of the AD conversion circuit into an analog signal;
a first amplifier circuit which amplifies the input analog signal with a predetermined gain, being arranged in parallel with the AD conversion circuit;
a subtractor circuit which subtracts, from the output of the first amplifier circuit, the output of the DA conversion circuit amplified with substantially the same gain as when amplified by the first amplifier circuit;
a second amplifier circuit which amplifies the output of the subtractor circuit with a predetermined gain, and feeds back the resultant to the AD conversion circuit and the first amplifier circuit;
a reference voltage control circuit which changes reference voltages to be supplied to a plurality of voltage comparison devices arranged in the AD conversion circuit;

an amplification control circuit which changes the gain of the first amplifier circuit temporally; and a timing control circuit which generates and supplies timing to the reference voltage control circuit, with the feedback to the AD conversion circuit as a single cycle of the timing, wherein the reference voltage control circuit changes the reference voltages temporally in accordance with the timing supplied from the timing control circuit.

7. An analog-to-digital converter which performs analog-to-digital conversion processing in a plurality of separate stages, the converter comprising;

an AD converson circuit which converts an input analog signal into a predetermined number of bits of digital value at least in any one of the plurality of stages;

a DA conversion circuit which converts the output of the AD conversion circuit into an analog signal;

a subtractor circuit which subtracts the output of the DA conversion circuit from the input analog signal;

an amplifier circuit which amplifies the output of the subtractor circuit for feedback;

a reference voltage control circuit which changes reference voltages to be supplied to a plurality of voltage comparison devices arranged in any of AD conversion circuits receiving feedback from the amplifier circuit;

a timing control circuit which generates and supplies timing to be reference voltage control circuit, with the feedback to the AD conversion circuit as a single cycle of the timing, wherein the reference voltage control circuit changes the reference voltages temporally in accordance with the timing supplied from the timing control circuit.

* * * * *